United States Patent
Lee

(10) Patent No.: US 9,876,178 B2
(45) Date of Patent: Jan. 23, 2018

(54) ORGANIC LIGHT EMITTING DEVICE AND DISPLAY DEVICE INCLUDING THE SAME

(71) Applicant: SAMSUNG DISPLAY CO., LTD., Yongin, Gyeonggi-Do (KR)

(72) Inventor: Injae Lee, Busan (KR)

(73) Assignee: SAMSUNG DISPLAY CO., LTD., Yongin, Gyeonggi-Do (KR)

(*) Notice: Subject to any disclaimer, the term of this patent is extended or adjusted under 35 U.S.C. 154(b) by 297 days.

(21) Appl. No.: 14/690,108

(22) Filed: Apr. 17, 2015

(65) Prior Publication Data

US 2016/0072075 A1 Mar. 10, 2016

(30) Foreign Application Priority Data

Sep. 5, 2014 (KR) .......................... 10-2014-0118543

(51) Int. Cl.
*H01L 51/50* (2006.01)
*H01L 51/00* (2006.01)

(52) U.S. Cl.
CPC ...... *H01L 51/0072* (2013.01); *H01L 51/0052* (2013.01); *H01L 51/508* (2013.01); *H01L 51/5072* (2013.01); *H01L 51/5088* (2013.01); *H01L 51/5092* (2013.01)

(58) Field of Classification Search
CPC .................. H01L 51/0052; H01L 51/0072
USPC .......................................................... 257/40
See application file for complete search history.

(56) References Cited

FOREIGN PATENT DOCUMENTS

| EP | 2879196 | * | 3/2015 |
|----|---------|---|--------|
| JP | 4794919 B9 | | 8/2011 |
| JP | 2013-530936 A | | 8/2013 |
| KP | 10-2013-0134451 A | | 12/2013 |
| KR | 10-2009-0112137 A | | 10/2009 |
| KR | 10-2011-0027484 A | | 3/2011 |
| KR | 10-2013-0100635 A | | 9/2013 |

* cited by examiner

*Primary Examiner* — Edward Cain
(74) *Attorney, Agent, or Firm* — Lee & Morse, P.C.

(57) ABSTRACT

An organic light emitting device and a display device including the same, the organic light emitting device including a first electrode; a light emitting layer on the first electrode; an electron transport layer on the light emitting layer; and a second electrode on the electron transport layer, wherein the electron transport layer includes a buffer layer, the buffer layer a buffer compound represented by the following Formula 1,

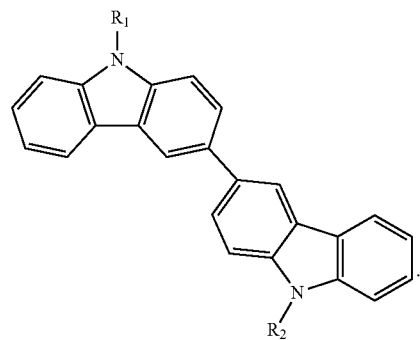

[Formula 1]

14 Claims, 5 Drawing Sheets

ORGANIC LIGHT EMITTING DEVICE AND DISPLAY DEVICE INCLUDING THE SAME

CROSS-REFERENCE TO RELATED APPLICATION

Korean Patent Application No. 10-2014-0118543, filed on Sep. 5, 2014, in the Korean Intellectual Property Office, and entitled: "Organic Light Emitting Device and Display Device Including the Same," is incorporated by reference herein in its entirety.

BACKGROUND

1. Field

Embodiments relate to an organic light emitting device and a display device including the same.

2. Description of the Related Art

Flat display devices are largely classified into a light emitting type and a light receiving type. The light emitting type may include a flat cathode ray tube, a plasma display panel, and an organic light emitting display (OLED), etc. The OLED, as a self-emitting type display device, may have a wide viewing angle, good contrast, and fast response speed.

Accordingly, the OLED gets the limelight and may be applied to a display device for a mobile device including a digital camera, a video camera, a camcorder, a personal digital assistant, a smart phone, an ultra-slim notebook, a tablet, or a personal computer, or a large electronic/electrical product such as an ultra-thin TV.

The OLED may realize colors according to a principle in which holes and electrons injected into first and second electrodes are recombined to emit light in an organic light emitting layer when excitons generated from combinations of the injected holes and electrons decay from the excited state to the ground state.

SUMMARY

Embodiments are directed to an organic light emitting device and a display device including the same.

The embodiments may be realized by providing an organic light emitting device including a first electrode; a light emitting layer on the first electrode; an electron transport layer on the light emitting layer; and a second electrode on the electron transport layer, wherein the electron transport layer includes a buffer layer, the buffer layer including a buffer compound represented by the following Formula 1,

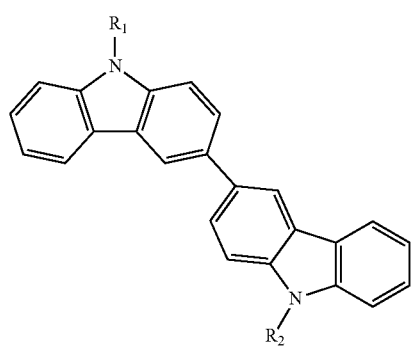

[Formula 1]

wherein, in Formula 1, $R_1$ and $R_2$ are each independently selected from a hydrogen, deuterium, a halogen atom, a cyano group, a nitro group, a hydroxy group, a carboxyl group, a substituted or unsubstituted aromatic ring having a carbon number of 6 to 20, a substituted or unsubstituted condensed aromatic ring having a carbon number of 6 to 20, a substituted or unsubstituted heteroaromatic ring having a carbon number of 6 to 20, a substituted or unsubstituted condensed heteroaromatic ring having a carbon number of 6 to 20, a substituted or unsubstituted aryloxy group having a carbon number of 6 to 20, a substituted or unsubstituted aryl amino group having a carbon number of 6 to 20, a substituted or unsubstituted diarylamino group having a carbon number of 6 to 20, and a substituted or unsubstituted arylalkyl group having a carbon number of 6 to 20.

$R_1$ and $R_2$ may each independently be selected from hydrogen, deuterium, a substituted or unsubstituted aromatic ring having a carbon number of 6 to 20, a substituted or unsubstituted heteroaromatic ring having a carbon number of 6 to 20, a substituted or unsubstituted aryloxy group having a carbon number of 6 to 20, a substituted or unsubstituted aryl amino group having a carbon number of 6 to 20, a substituted or unsubstituted diarylamino group having a carbon number of 6 to 20, and a substituted or unsubstituted arylalkyl group having a carbon number of 6 to 20.

$R_1$ may be selected from a phenyl group, a naphthyl group, a biphenyl group, a terphenyl group, an anthracenyl group, a fluorenyl group, and a carbazolyl group.

$R_2$ may be selected from a halogen atom, a cyano group, a nitro group, a hydroxy group, and a carboxyl group.

The buffer compound may be a compound represented by the following Formula 2:

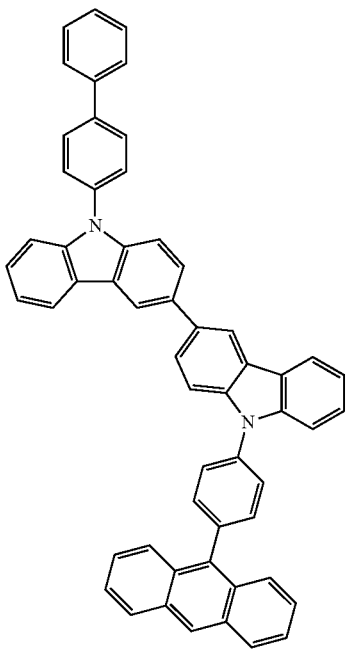

[Formula 2]

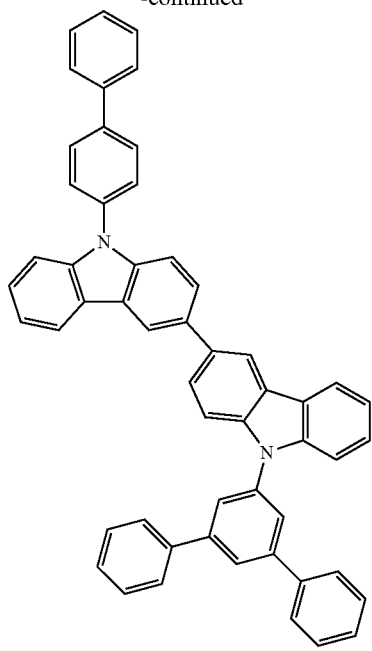
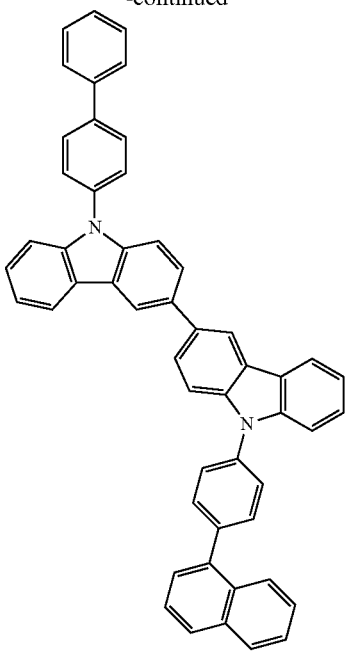
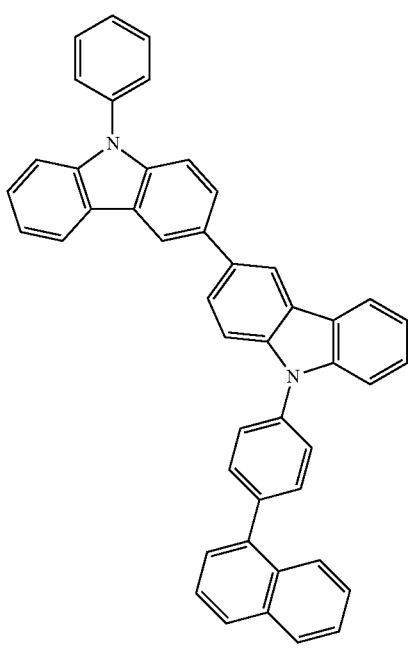
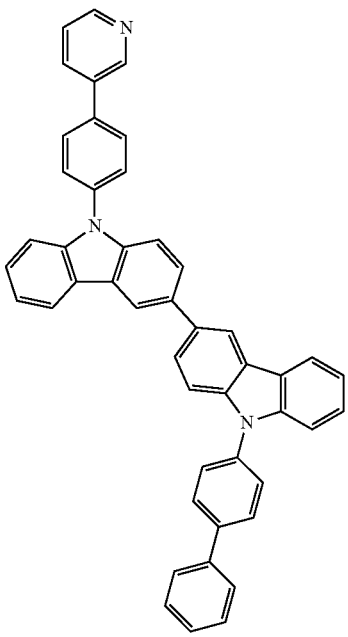

-continued
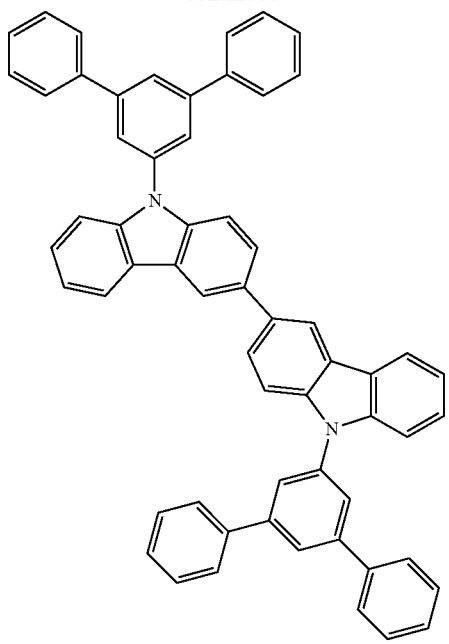
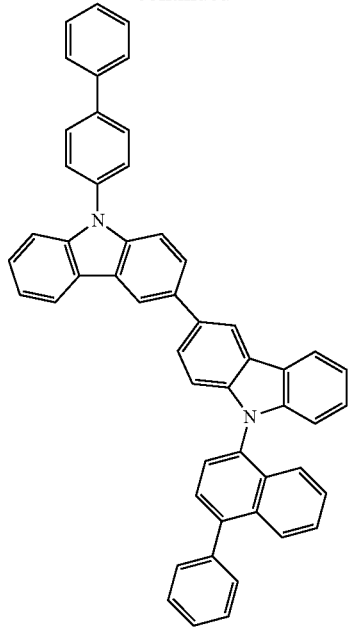
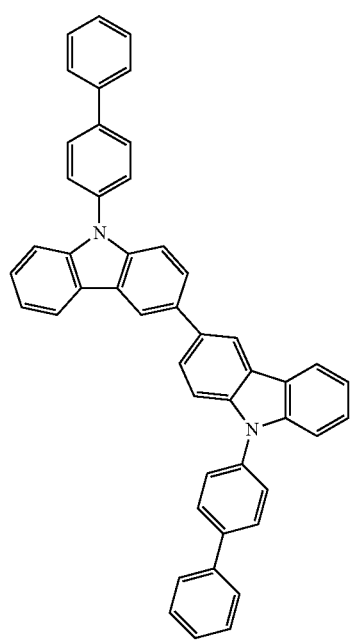
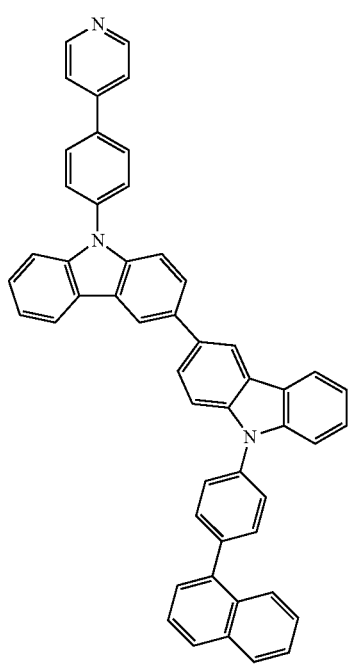

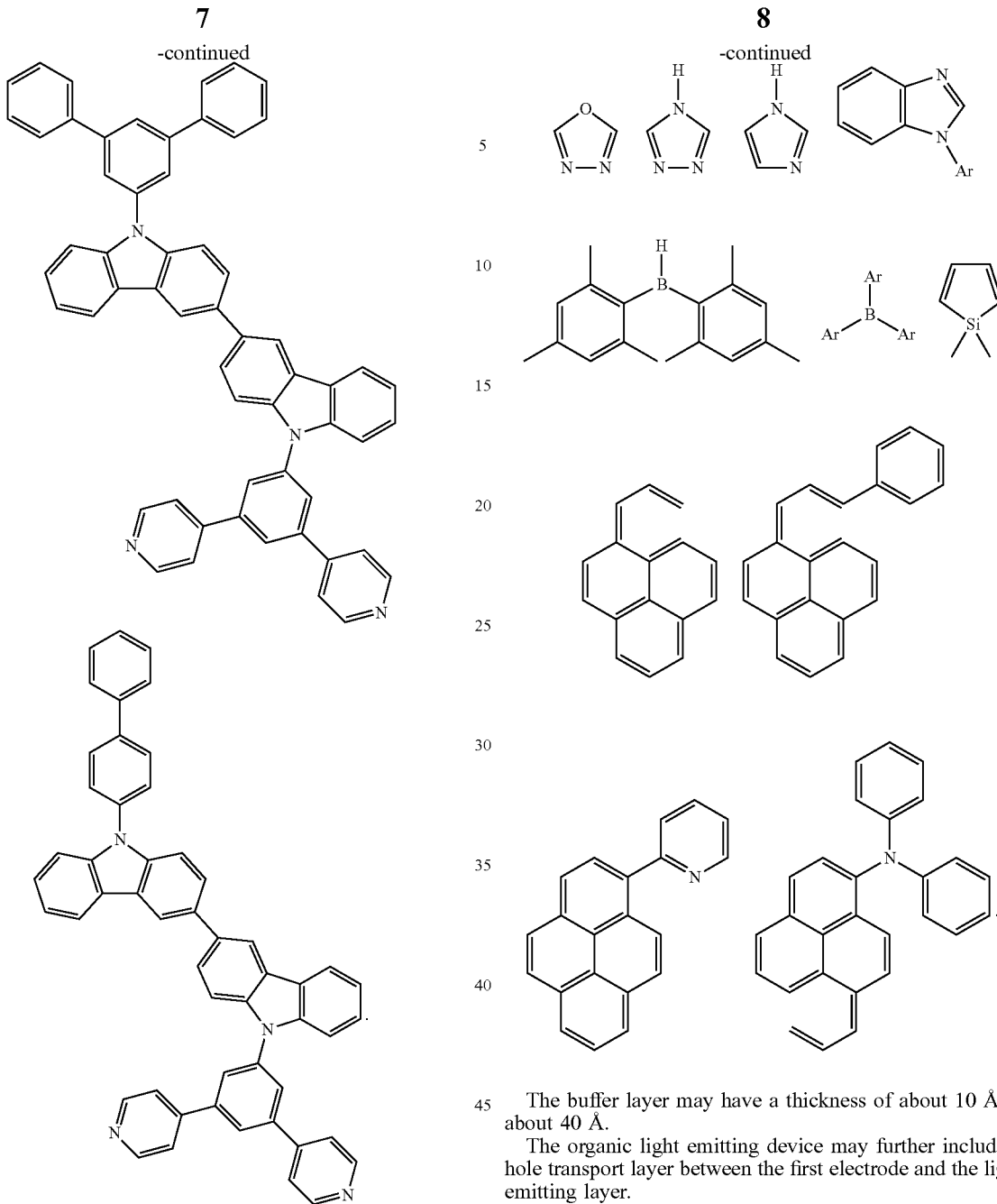

The electron transport layer may include a first electron transport layer on the light emitting layer; the buffer layer on the first electron transport layer; and a second electron transport layer on the buffer layer.

At least one of the first electron transport layer and the second electron transport layer may include an electron transport compound, and the electron transport compound may include a compound or moiety represented by the following Formula 3:

[Formula 3]

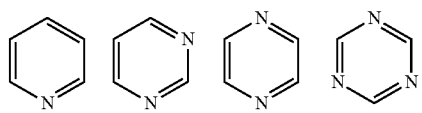

The buffer layer may have a thickness of about 10 Å to about 40 Å.

The organic light emitting device may further include a hole transport layer between the first electrode and the light emitting layer.

The hole transport layer may include at least one selected from N-phenylcarbazole, polyvinylcarbazole, N,N'-bis(3-methylphenyl)-N,N-diphenyl-[1,1-biphenyl]-4,4'-diamine, N,N-di(1-naphthyl)-N,N-diphenylbenzidine, 4,4',4"-tris(N-carbazolyl)triphenylamine), and 4,4'-cyclohexylidenebis[N, N-bis(4-methylphenyl)benzenamine].

The organic light emitting device may further include a hole injection layer between the first electrode and the hole transport layer.

The hole injection layer may include at least one selected from copper phthalocyanine, N,N'-diphenyl-N,N'-bis-[4-(phenyl-m-tolyl-amino)-phenyl]-biphenyl-4,4'-diamine, 4,4',4"-tris(3-methylphenylphenylamino)triphenylamine, 4,4'4"-tris(N,N-diphenylamino)triphenylamine, 4,4',4"-tris{N,-(2-naphthyl)-N-phenylamino}-triphenylamine, poly (3,4-ethylenedioxythiophene)/poly(4-styrenesulfonate), polyaniline/dodecylbenzenesulfonic acid, polyaniline/camphor sulfonic acid, and polyaniline/poly(4-styrenesulfonate).

The organic light emitting device may further include an electron injection layer between the electron transport layer and the second electrode.

The electron injection layer may include at least one selected from LiF, LiQ, Li$_2$O, BaO, NaCl, and CsF.

The embodiments may be realized by providing a display device comprising a plurality of pixels, wherein at least one of the plurality of pixels includes a first electrode; a light emitting layer on the first electrode; an electron transport layer on the light emitting layer; and a second electrode on the electron transport layer, wherein the electron transport layer includes a buffer layer, the buffer layer including a buffer compound represented by the following Formula 1:

[Formula 1]

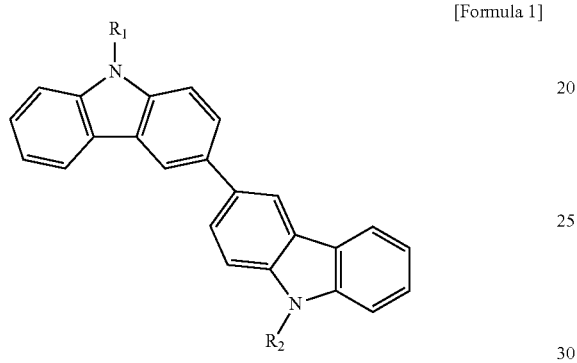

wherein, in Formula 1, R$_1$ and R$_2$ are each independently selected from a hydrogen, deuterium, a halogen atom, a cyano group, a nitro group, a hydroxy group, a carboxyl group, a substituted or unsubstituted aromatic ring having a carbon number of 6 to 20, a substituted or unsubstituted condensed aromatic ring having a carbon number of 6 to 20, a substituted or unsubstituted heteroaromatic ring having a carbon number of 6 to 20, a substituted or unsubstituted condensed heteroaromatic ring having a carbon number of 6 to 20, a substituted or unsubstituted aryloxy group having a carbon number of 6 to 20, a substituted or unsubstituted aryl amino group having a carbon number of 6 to 20, a substituted or unsubstituted diarylamino group having a carbon number of 6 to 20, and a substituted or unsubstituted arylalkyl group having a carbon number of 6 to 20.

R$_1$ and R$_2$ may each independently be selected from hydrogen, deuterium, a substituted or unsubstituted aromatic ring having a carbon number of 6 to 20, a substituted or unsubstituted heteroaromatic ring having a carbon number of 6 to 20, a substituted or unsubstituted aryloxy group having a carbon number of 6 to 20, a substituted or unsubstituted aryl amino group having a carbon number of 6 to 20, a substituted or unsubstituted diarylamino group having a carbon number of 6 to 20, and a substituted or unsubstituted arylalkyl group having a carbon number of 6 to 20.

R$_1$ may be selected from a phenyl group, a naphthyl group, a biphenyl group, a terphenyl group, an anthracenyl group, a fluorenyl group, and a carbazolyl group.

R$_2$ may be selected from a halogen atom, a cyano group, a nitro group, a hydroxy group, and a carboxyl group.

The buffer compound may be a compound represented by the following Formula 2:

[Formula 2]

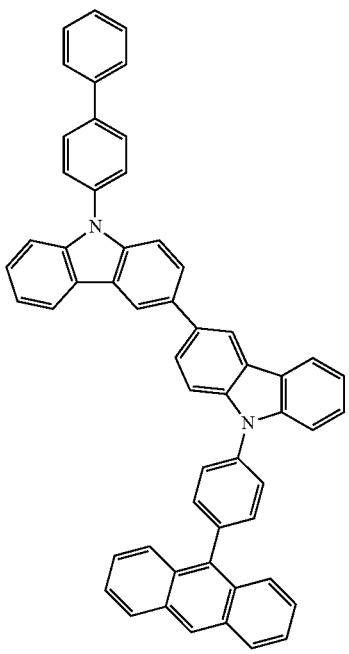

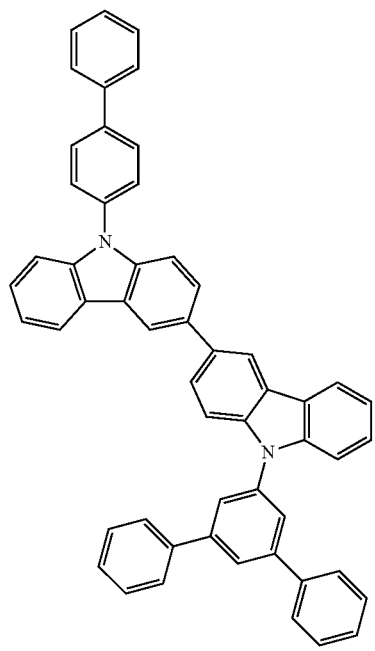

11
-continued
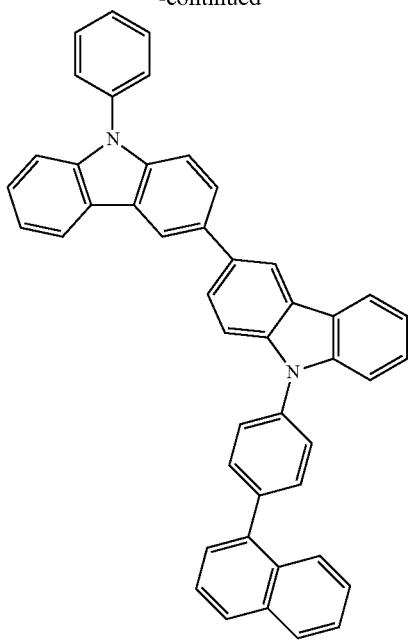
12
-continued
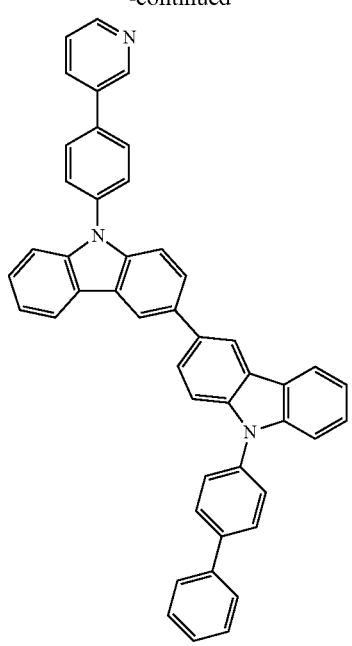
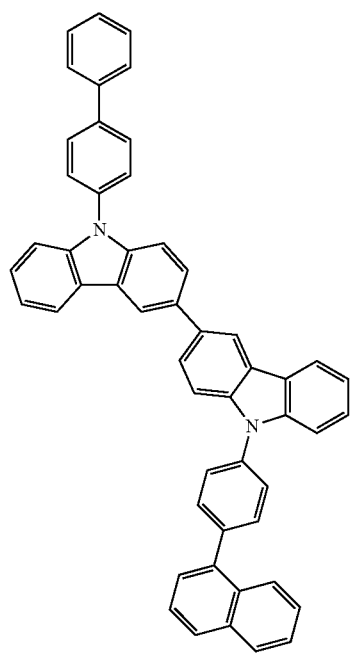
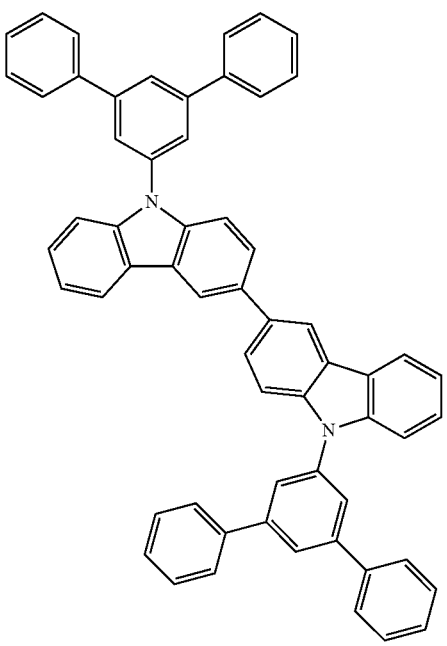

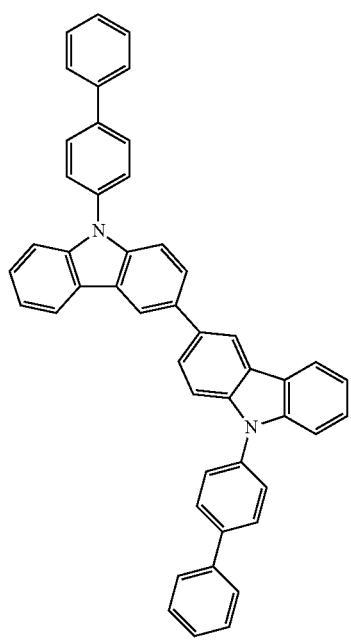
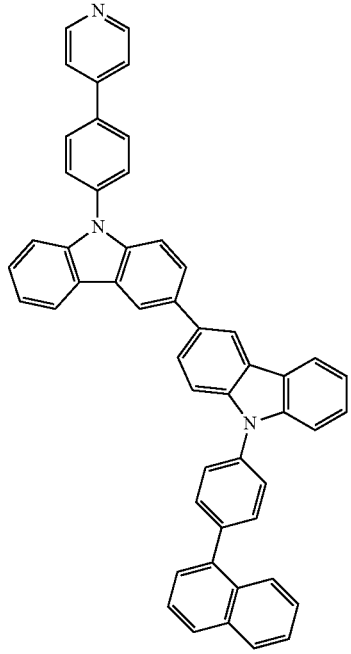
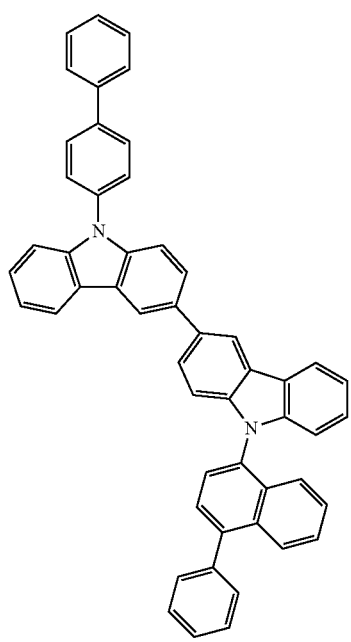
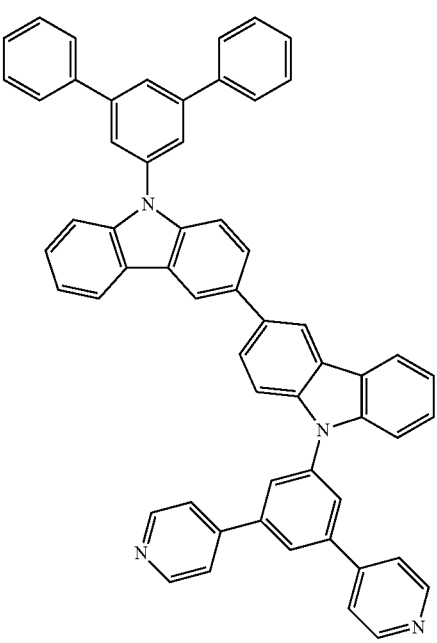

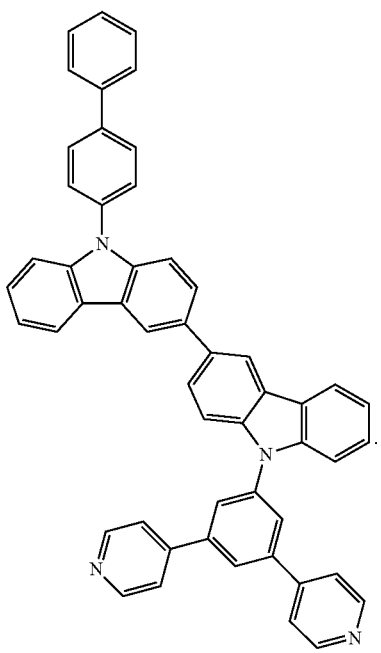

The electron transport layer may include a first electron transport layer on the light emitting layer; the buffer layer on the first electron transport layer; and a second electron transport layer on the buffer layer.

At least one of the first electron transport layer and the second electron transport layer may include an electron transport compound, and the electron transport compound may include a compound or moiety represented by the following Formula 3:

[Formula 3]

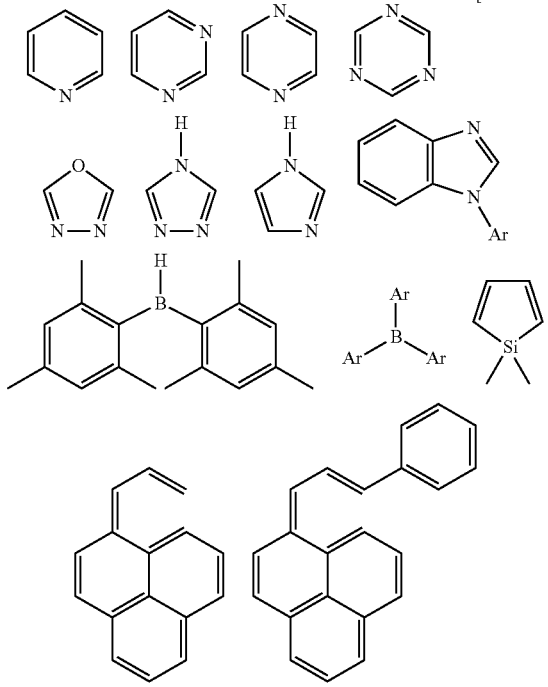

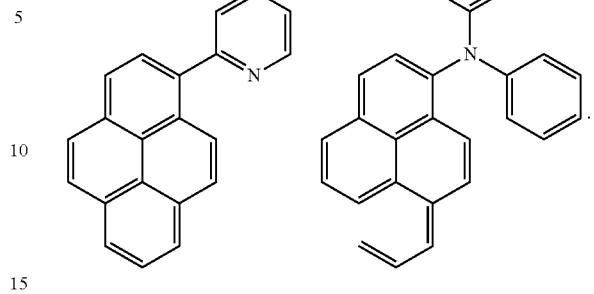

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
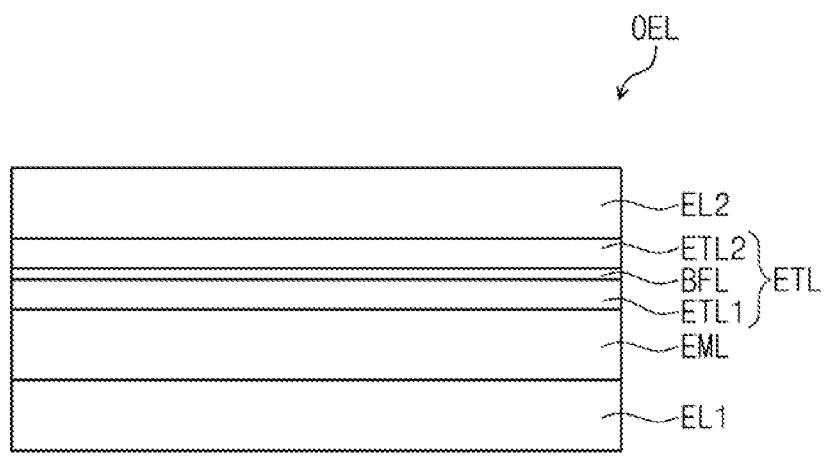
FIG. 1 illustrates a schematic cross-sectional view of an organic light emitting device according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. Like reference numerals refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the singular forms "a," "an" and "the" are intended to include the plural forms as well, unless the context clearly indicates otherwise.

It will be further understood that the terms "comprises", "comprising,", "includes" and/or "including", when used herein, specify the presence of stated features, integers, steps, operations, elements, components or combinations thereof, but do not preclude the presence or addition of one or more other features, integers, steps, operations, elements, components, or combinations thereof. It will also be understood that when a part such as a layer, a film, a region, or a plate, etc., is referred to as being 'on' another part, it can be "directly on" the other part, or intervening part may also be present. On the contrary, it will be understood that when a part such as a layer, a film, a region, or a plate, etc., is referred to as being 'under' another part, it can be "directly under", and one or more intervening parts may also be present.

FIG. 1 illustrates a schematic cross-sectional view of an organic light emitting device according to an embodiment.

Referring to FIG. 1, an organic light emitting device OEL according to an embodiment may include a first electrode EL1, a light emitting layer EML on the first electrode EL1, an electron transport layer ETL on the light emitting layer EML, and a second electrode EL2 on the electron transport layer ETL.

The first electrode EL1 may have conductivity. The first electrode EL1 may be a pixel electrode or an anode.

The first electrode EL1 may be a transparent electrode or a reflective electrode. When the first electrode EL1 is the transparent electrode, the first electrode EL1 may be formed of a transparent metal oxide, e.g., indium tin oxide (ITO), indium zinc oxide (IZO), zinc oxide (ZnO), or indium tin zinc oxide (ITZO), etc. When the first electrode EL1 is the reflective electrode, the first electrode EL1 may include a reflective film formed of Ag, Mg, Al, Pt, Pd, Au, Ni, Nd, Ir, Cr, or a compound thereof, and a transparent conductive film formed of ITO, IZO, ZnO, or ITZO, etc.

The light emitting layer EML may be on the first electrode EL1. The light emitting layer EML may be formed by using a method such as vapor deposition, spin coating, a casting method, or a Langmuir-Blodgett (LB) method, etc.

The light emitting layer EML may be formed of, e.g., a material emitting lights of red, green and blue colors, and may include a fluorescent material or phosphorescent material. When the light emitting layer EML includes the phosphorescent material, the light emitting layer EML may include a host and a dopant. In an implementation, the host material may include, e.g., tris(8-quinolinolate)aluminum (Alq3), 4,4'-bis(N-carbazolyl)-1,1'-biphenyl (CBP), poly(n-vinylcabazole) (PVK), 9,10-di(naphthalene-2-yl)anthracene (ADN), 4,4',4"-Tris(carbazol-9-yl)-triphenylamine (TCTA), 1,3,5-tris(N-phenylbenzimidazole-2-yl)benzene (TPBi), 3-tert-butyl-9,10-di(naphth-2-yl)anthracene (TBADN), distyrylarylene (DSA), 4,4'-bis(9-carbazolyl)-2,2'-dimethyl-biphenyl (CDBP), 2-Methyl-9,10-bis(naphthalen-2-yl)an-thracene (MADN), etc.

When the light emitting layer EML emits a red light, the light emitting layer may include, e.g., PBD:Eu(DBM)3 (Phen) or perylene. When the light emitting layer EML emits a red light, a dopant included in the light emitting layer EML may include, e.g., any one selected from PIQIr(acac)(bis(1-phenylisoquinoline)acetylacetonate iridium), PQIr(acac)(bis (1-phenylquinoline)acetylacetonate iridium), PQIr(tris(1-phenylquinoline)iridium), and PtOEP(octaethylporphyrin platinum).

When the light emitting layer EML emits a green light, the light emitting layer may include, e.g., Alq3(tris(8-hydroxy-quinolino)aluminum). When the light emitting layer emits a green light, a dopant included in the light emitting layer EML may include, e.g., Ir(ppy)$_3$(fac tris(2-phenylpyridine) iridium).

When the light emitting layer EML emits a blue light, the light emitting layer EML may include a fluorescent material including, e.g., spiro-DPVBi, spiro-6P, distylbenzene (DSB), distrylarylene (DSA), PFO-based polymer, and/or PPV-based polymer. When the light emitting layer emits a green light, a dopant included in the light emitting layer EML may include, e.g., (4,6-F$_2$ppy)$_2$Irpic.

The electron transport layer ETL may be on the light emitting layer EML. A thickness of the electron transport layer ETL may be about 200 Å to about 400 Å, e.g., about 250 Å to about 350 Å. The electron transport layer ETL may be formed by using, e.g., vapor deposition, spin coating, a casting method, or an LB method.

The electron transport layer ETL may include a buffer layer BFL. The buffer layer BFL may include a buffer compound represented by the following Formula 1.

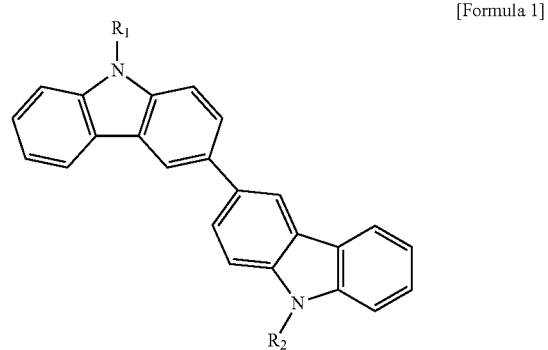

[Formula 1]

In an implementation, in Formula 1, $R_1$ and $R_2$ may each independently be selected from or include, e.g., hydrogen, deuterium, a substituted or unsubstituted aromatic ring having a carbon number of 6 to 20, a substituted or unsubstituted condensed aromatic ring having a carbon number of 6 to 20, a substituted or unsubstituted hetero aromatic ring having a carbon number of 6 to 20, and a substituted or unsubstituted condensed hetero aromatic ring having a carbon number of 6 to 20. In an implementation, $R_1$ and $R_2$ may each independently be selected from or include, e.g., a substituted or unsubstituted hetero aromatic ring including N, S, or O having a carbon number of 6 to 20, and/or a substituted or unsubstituted condensed hetero aromatic ring including N, S, or O having a carbon number of 6 to 20.

In an implementation, in Formula 1, $R_1$ and $R_2$ may each independently be selected from or include, e.g., hydrogen, deuterium, a substituted or unsubstituted aryl group having a carbon number of 6 to 20, a substituted or unsubstituted heteroaryl group having a carbon number of 6 to 20, a substituted or unsubstituted aryloxy group having a carbon number of 6 to 20, a substituted or unsubstituted aryl amino group having a carbon number of 6 to 20, a substituted or unsubstituted diarylamino group having a carbon number of 6 to 20, and/or a substituted or unsubstituted arylalkyl group having a carbon number of 6 to 20.

In an implementation, $R_1$ may be selected from or may include, e.g., a phenyl group, a naphthyl group, a biphenyl group, a terphenyl group, an anthracene group, a fluorenyl group, and a carbazolyl group.

In an implementation, $R_2$ may be selected from or may include, e.g., a halogen atom, a cyano group, a nitro group, a hydroxy group, and/or a carboxyl group.

In an implementation, the buffer compound represented by Formula 1 may be, e.g., a compound represented by or selected from the following Formula 2.

[Formula 2]
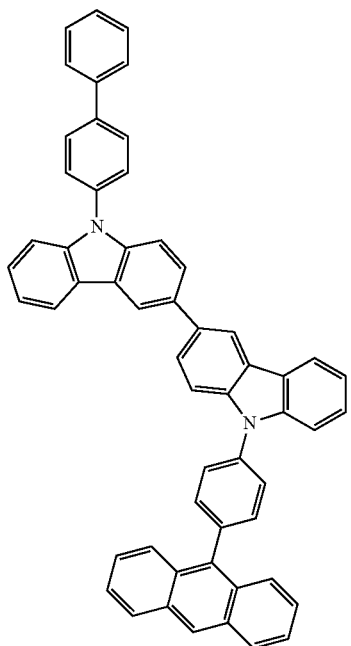
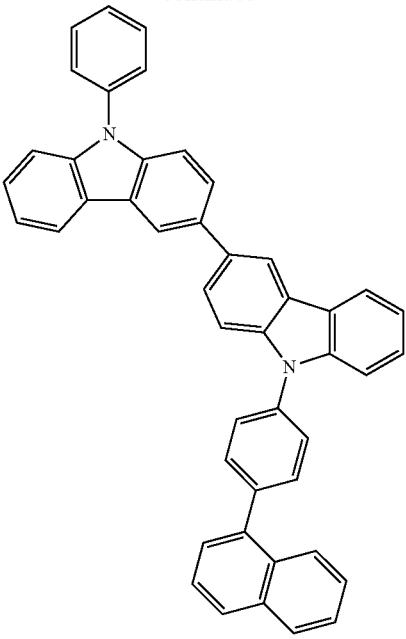
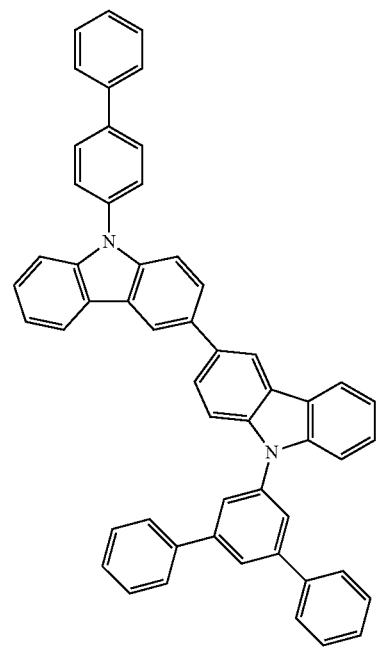 [SMILES: c1ccc(-c2ccc(-n3c4ccccc4c4cc(-c5ccc6c(c5)c5ccccc5n6-c5cc(-c6ccncc6)cc(-c6ccncc6)c5)ccc43)cc2)cc1]
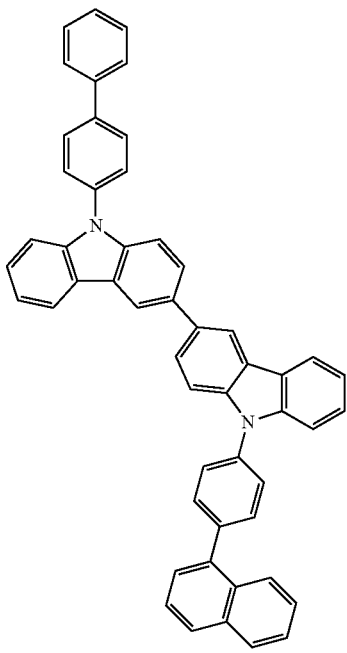

21
-continued
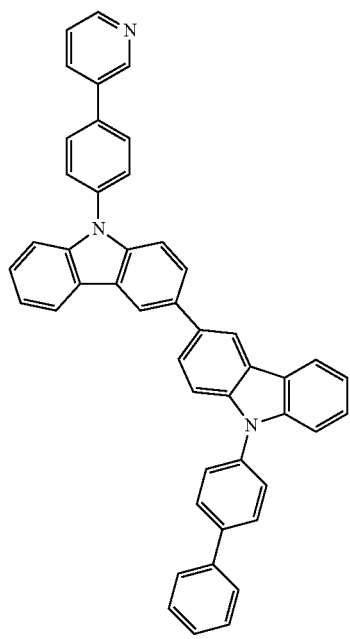
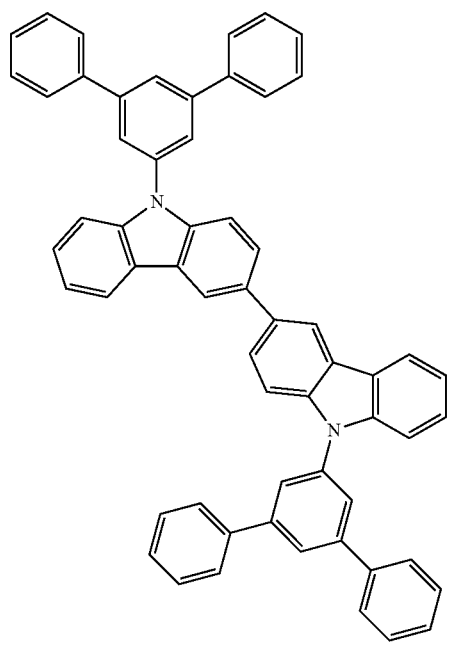
22
-continued
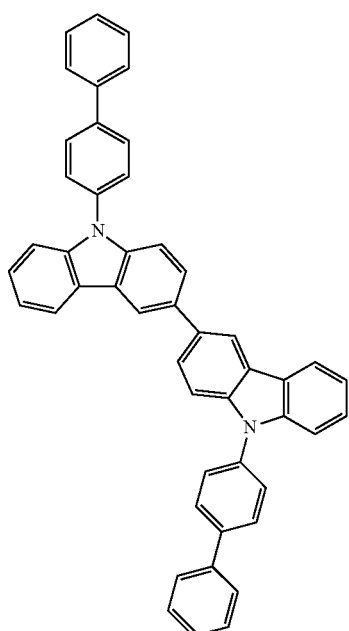
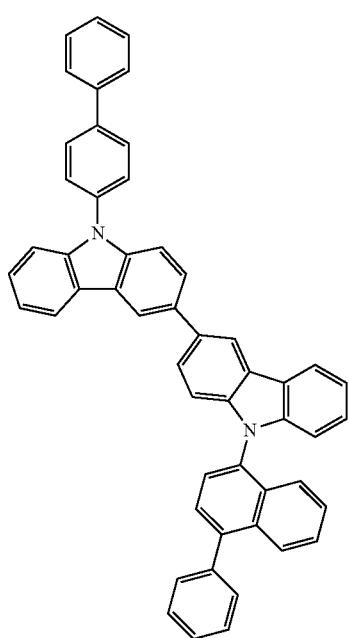

-continued

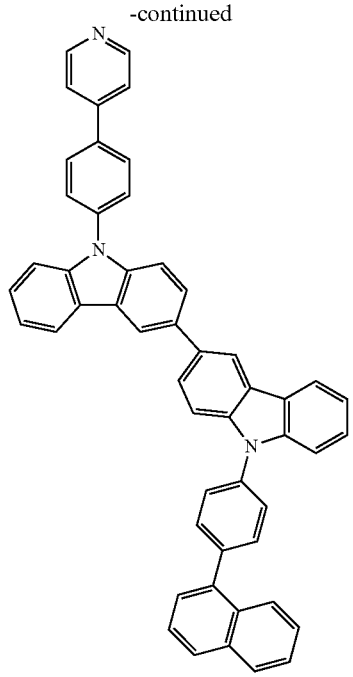

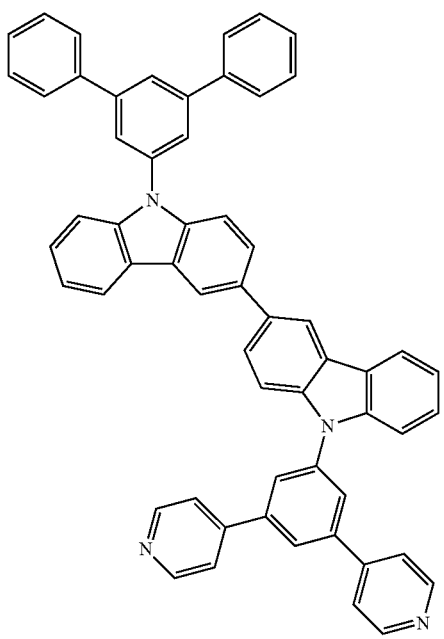

-continued

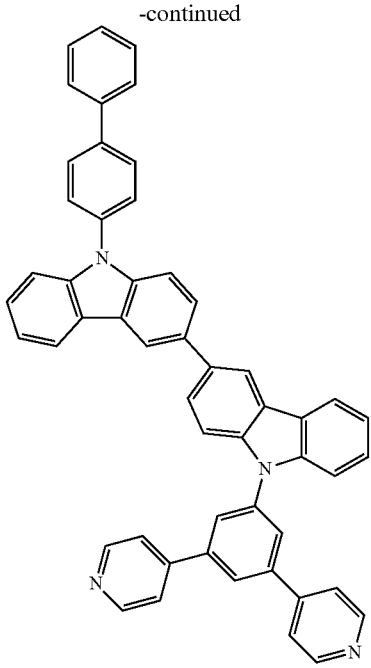

The electron transport layer ETL may include, e.g., a first electron transport layer ETL1, the buffer layer BFL, and a second electron transport layer ETL2. In an implementation, the first or second electron transport layer ETL1 or ETL2 may be omitted, if desired.

At least one of the first and second electronic transport layers ETL1 and ETL2 may include an electron transport compound. The electron transport compound may include, e.g., a compound or moiety (e.g., in a molecular structure thereof) represented by or selected from the following Formula 3.

[Formula 3]

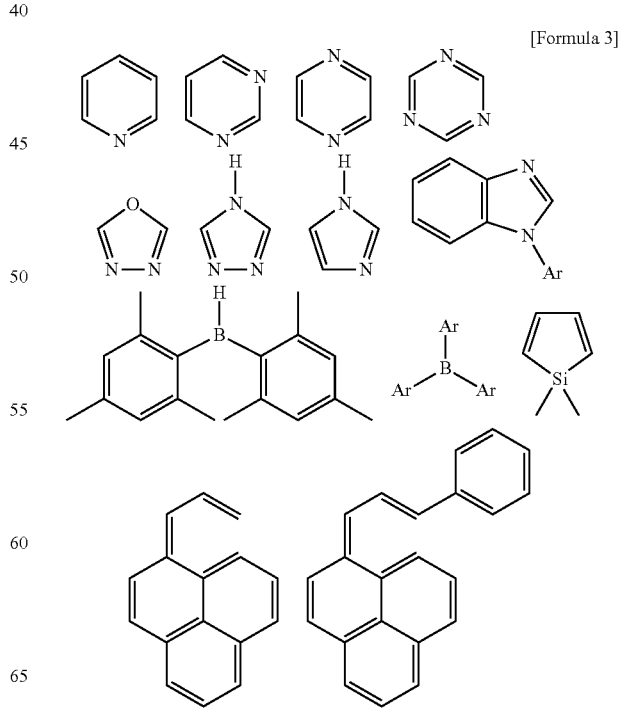

-continued

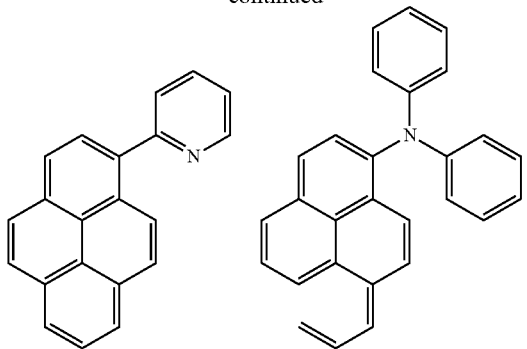

The second electrode may be on the electron transport layer ETL. The second electrode EL2 may be a common electrode or a cathode.

The second electrode EL2 may be a transparent electrode or a reflective electrode. When the second electrode EL2 is the transparent electrode, the second electrode EL2 may include a film formed by depositing Li, Ca, LiF/Ca, LiF/Al, Al, Mg or a compound thereof on the light emitting layer, and an auxiliary electrode formed of a transparent metal oxide, e.g., ITO, IZO, ZnO, or ITZO, etc., on the film. When the second electrode EL2 is the reflective electrode, the second electrode EL2 may include a reflective film formed of Ag, Mg, Al, Pt, Pd, Au, Ni, Nd, Ir, Cr, or a compound thereof, and a transparent conductive film formed of ITO, IZO, ZnO, or ITZO, etc.

When the organic light emitting device OEL is a front emitting type, the first electrode EL1 may be the reflective electrode and the second electrode EL2 may be the transparent electrode. When the organic light emitting device OEL is a rear emitting type, the first electrode EL1 may be the transparent electrode and the second electrode EL2 may be the reflective electrode.

In the organic light emitting device according to an embodiment, the first and second electrodes EL1 and EL2 may respectively receive voltages, holes injected from the first electrode EL1 may move to the light emitting layer EML, and electrons injected from the second electrode EL2 may move to the light emitting layer EML via the electron transport layer ETL. The electrons and the holes may be recombined in the light emitting layer EML to create excitons, and the excitons may decay from their excited state to the ground state to emit lights.

A moving speed of the electrons may be slower than that of the holes in an organic light emitting device, and a band gap may occur between the energy band of the light emitting layer and the energy band of the electron transport layer. Accordingly, a ratio that the electrons and the holes meet in the light emitting layer may be low, electron injection to the light emitting layer may not be easy, and the light emitting efficiency could be lowered.

An organic light emitting device according to an embodiment may help reduce the band gap between the energy band of the light emitting layer and the energy band of the electron transport layer, and may facilitate electron injection to the light emitting layer by, e.g., including the buffer layer BFL that includes the buffer compound represented by Formula 1. Accordingly, the organic light emitting device OEL according to an embodiment may promote high efficiency and long life.

Figure 2:
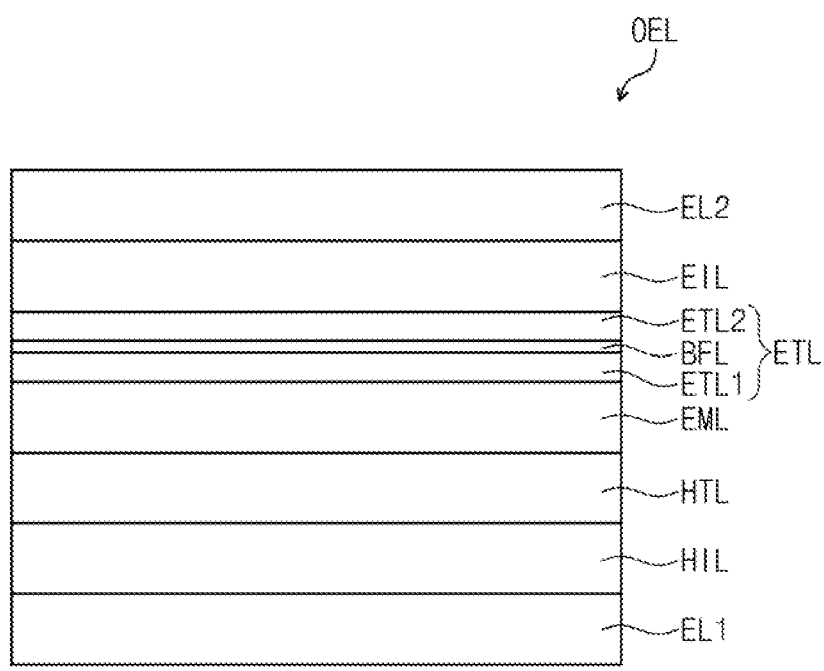
FIG. 2 illustrates a schematic cross-sectional view of an organic light emitting device according to an embodiment.

FIG. 2 illustrates a schematic cross-sectional view of an organic light emitting device according to an embodiment.

Referring to FIG. 2, an organic light emitting device OEL according to an embodiment may further include, e.g., a hole injection layer HIL, a hole transport layer HTL, and an electron injection layer EIL (in addition to the layers described above with respect to FIG. 1). Even though FIG. 2 illustrates that the hole injection layer HIL, the hole transport layer HTL, and the electron injection layer EIL are all formed, in an implementation, a part thereof or any layers may be omitted.

For example, only the electron transport layer ETL and the electron injection layer EIL may be provided between the light emitting layer EML and the second electrode EL2, without the hole transport layer HTL, or only the hole transport layer HTL and the electron transport layer ETL may be provided, without the electron injection layer EIL.

The hole injection layer HIL may be on the first electrode EL1. The hole injection layer may include, e.g., phthalocyanine compounds such as copper phthalocyanine, N,N-diphenyl-N,N-bis-[4-(phenyl-m-tolyl-amino)-phenyl]-bi-phenyl-4,4'-diamine (DNTPD), 4,4',4"-tris(3-methylphenylphenylamino)triphenylamine (m-MTDATA), 4,4'4"-Tris(N,N-diphenylamino)triphenylamine (TDATA), 4,4',4"-tris{N,-(2-naphthyl)-N-phenylamino}-triphenylamine (2TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonic acid (PANI/CSA), and/or polyaniline/poly(4-styrenesulfonate) (PANI/PSS).

The hole injection layer HIL may be formed by using various methods including, e.g., vapor deposition, spin coating, a casting method, or an LB method. When the hole injection layer HIL is formed by the vapor deposition or spin coating, the forming condition may vary according to compounds used as a material and/or target characteristics of the hole injection layer HIL.

The hole injection layer HIL may have a thickness of about 100 Å to about 10,000 Å, e.g. about 100 Å to about 1,000 Å.

The hole transport layer HTL may be on the hole injection layer HIL. The hole transporting layer may include, e.g., carbazole derivatives such as N-phenylcarbazole, and poly-vinylcarbazole, triphenylamine-based derivatives such as N,N'-bis(3-methylphenyl)-N,N'-diphenyl-[1,1-biphenyl]-4,4'-diamine (TPD), N,N'-di(1-naphthyl)-N,N'-diphenylbenzidine (NPB), 4,4',4"-tris(N-carbazolyl)triphenylamine (TCTA), 4,4'-cyclohexylidenebis[N,N-bis(4-methylphenyl)benzenamine] (TAPC), etc.

The hole transport layer HTL may have a thickness of about 50 Å to about 1,000 Å, e.g., about 100 Å to about 800 Å. The hole injection layer HIL may be formed by, e.g., using a method such as vapor deposition, spin coating, a casting method, or an LB method.

When the hole transport layer HTL is formed by the vapor deposition, the deposition condition may vary according to a compound used as a material of the hole transport layer HTL and/or target characteristics of the hole transport layer HTL, etc. In an implementation, the deposition condition may include, e.g., a deposition temperature in a range of about 100° C. to about 500° C., a degree of vacuum in a range of about $10^{-8}$ Torr to about $10^{-3}$ Torr, a deposition rate of about 0.01 Å/sec to about 100 Å/sec. When the hole transport layer HTL is formed by the spin coating, the coating condition may vary according to a compound used as a material of the hole transport layer HTL and target characteristics of the hole transport layer HTL. For example, the coating speed may be properly selected in a range of about 2,000 rpm to about 5,000 rpm, and the thermal process temperature may be about 80° C. to 200° C.

The hole transport layer HTL and the hole injection layer HIL may be formed as separate layers, or may be manufactured as a single layer (referred to as a hole function layer, not shown) performing all functions of the hole injection and the hole transport. In this case, the hole function layer may include one or more of the above-described hole injection layer material and the hole transport layer material. In this case, a thickness of the hole function layer may be about 500 Å to 10,000 Å, e.g., about 100 Å to about 1,000 Å.

The hole injection layer HIL, the hole transport layer HTL, or the hole function layer may further include a charge-generating material for improving conductivity of a film, in addition to the hole injection material and the hole transport material. The charge-generating material may be, e.g., a p-dopant. An example of the p-dopant may include quinone derivatives such as tetracyanoquinodimethane (TCNQ) and 2,3,5,6-tetrafluoro-tetracyano-1,4-benzoquinonedimethane (F4TCNQ), a metal oxide such as tungsten oxide and molybdenum oxide, and a compound containing a cyano group, etc.

When the hole injection layer HIL, the hole transport layer HTL, or the hole function layer further includes the charge-generating material, the charge-generating material may be homogeneously dispersed, heterogeneously dispersed, or distributed to have a concentration gradient in the layers.

The electron injection layer EIL may be on the electronic transport layer ETL. The electron injection layer EIL may be formed of a metal containing material. The metal-contained material may include, e.g., LiF, lithium quinolate (LiQ), $Li_2O$, BaO, NaCl, CsF, etc. The electron injection layer EIL may be formed by vapor-thermal-depositing or spin-coating the electron injection material with a typical method on a surface of the electron transport layer ETL.

The electron injection layer EIL may also be formed of or include a material in which the electron transport material and an organo metal salt having insulation property are mixed. The organo metal salt may be a material having an energy band gap of approximately 4 eV or greater. For example, the organo metal salt may include metal acetate, metal benzoate, metal acetoacetate, metal acetylacetonate, or metal stearate.

The organic light emitting device OEL having the above-described structure may facilitate stable injection and transportation of electrons and holes to the light emitting layer like the organic light emitting device OEL according to the above-described embodiment, and accordingly light emitting efficiency may be improved.

An organic light emitting device according to an embodiment may help reduce the band gap between the energy band of the light emitting layer and the energy band of the electron transport layer, and may facilitate electron injection to the light emitting layer by including the buffer layer BFL that include the buffer compound represented by Formula 1. Accordingly, the organic light emitting device OEL according to an embodiment may promote high efficiency and long life.

Hereinafter, description is provided about a display device 10 according to an embodiment. Hereinafter, differences from the foregoing organic light emitting device OEL according to an embodiment are mainly described, and undescribed parts may follow the forgoing organic light emitting device OEL according to an embodiment.

Figure 3:
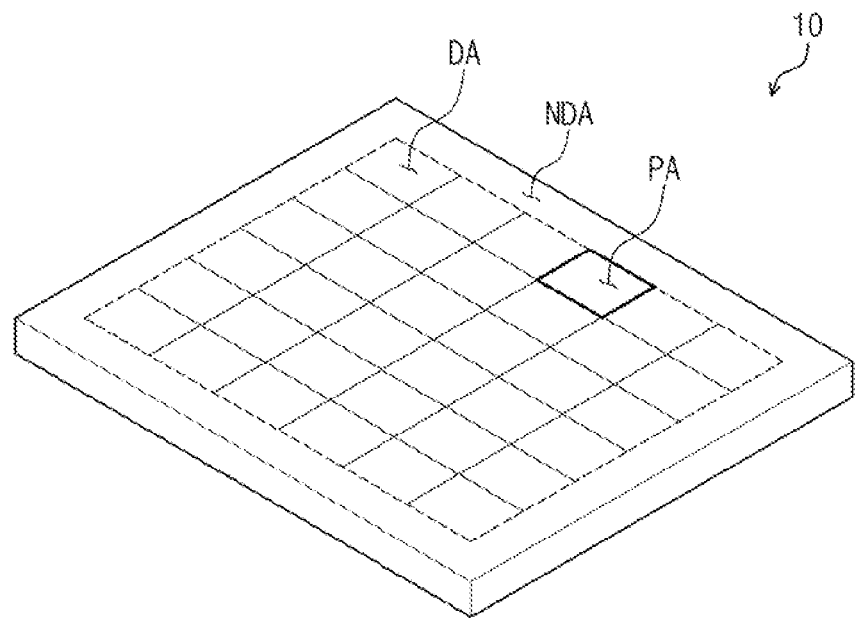
FIG. 3 illustrates a schematic perspective view of a display device according to an embodiment.

FIG. 3 illustrates a schematic perspective view of a display device 10 according to an embodiment.

Referring to FIG. 3, the display device 10 according to an embodiment may include a display area DA and a non-display area NDA.

The display area DA displays an image. The display area DA may have an approximate rectangular shape.

The display area DA may include a plurality of pixel areas PA. The plurality of pixel areas PA may be arranged in a matrix type. The plurality of pixel areas PA may be defined by a pixel defining layer (PDL in FIG. 6). The plurality of pixel areas PA may include a plurality of pixels (PXL in FIG. 4), respectively.

The non-display area NDA does not display an image. The non-display area NDA may, e.g., surround the display area DA.

Figure 4:
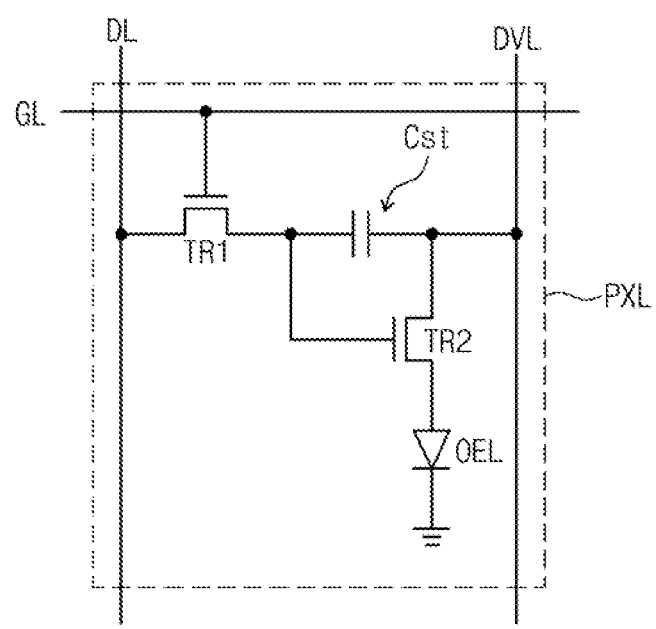
FIG. 4 illustrates a circuit diagram of a pixel included in a display device according to an embodiment.

FIG. 4 illustrates a circuit diagram of a pixel included in a display device 10 according to an embodiment.

Figure 5:
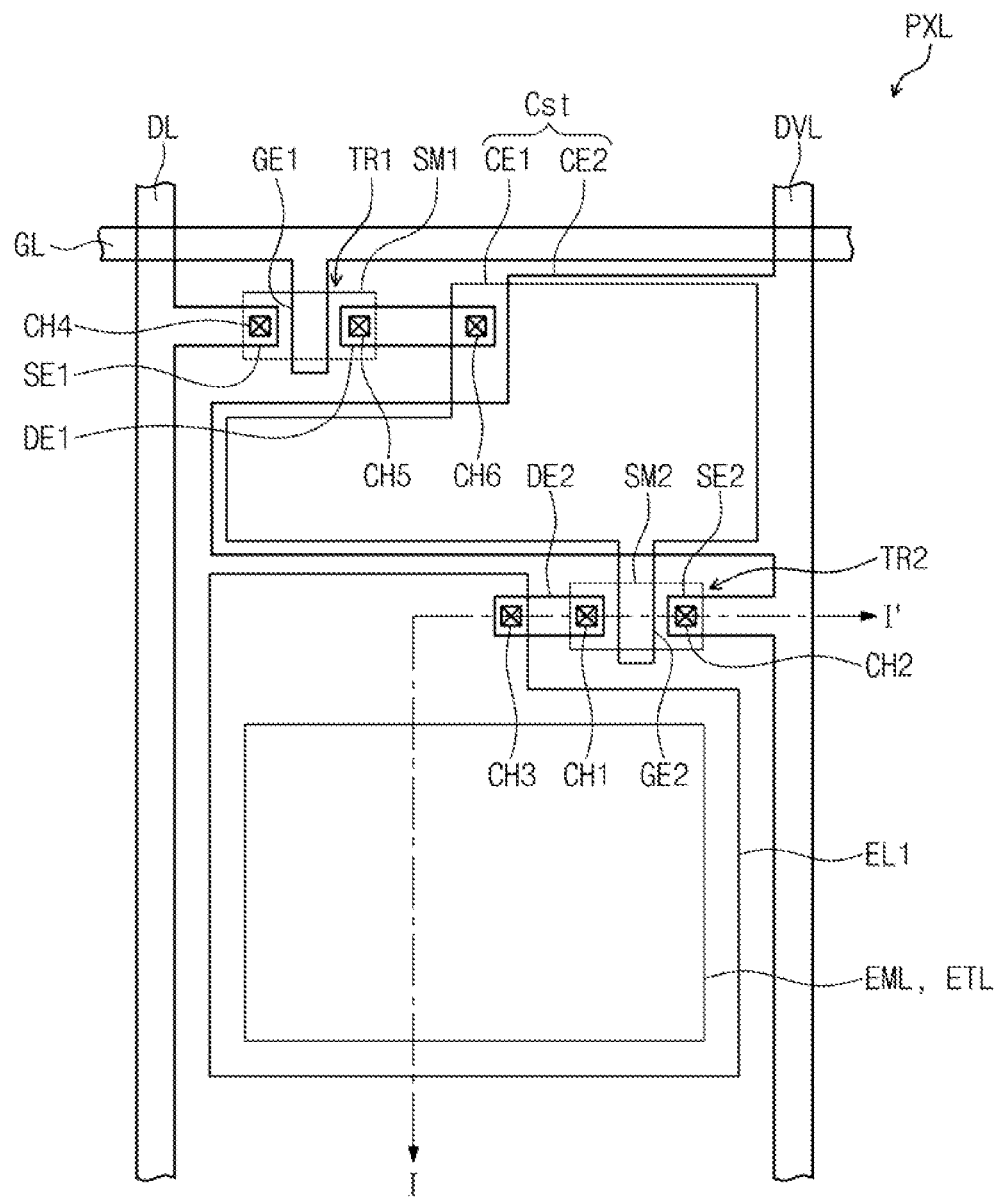
FIG. 5 illustrates a plan view of a pixel included in a display device according to an embodiment.

FIG. 5 illustrates a plan view of a pixel included in a display device 10 according to an embodiment.

Referring to FIGS. 4 and 5, each pixel PXL may include an interconnection unit including a gate line GL, a data line DL, and a driving voltage line DVL, a thin film transistor connected to the interconnection unit, an organic light emitting device OEL connected to the thin film transistor, and a capacitor Cst.

Each pixel PXL may emit a light of a specific color, e.g., one of a red light, a green light, and a blue light. A kind of the color light is not limited to the above-described, and, e.g., a cyan light, a magenta light, or a yellow light may be emitted.

The gate line GL may be extended in a first direction (e.g., DR1 in FIG. 4). The data line DL may be extended in a second direction (e.g., DR2 in FIG. 4) intersecting with the gate line GL. The driving voltage line DVL may be extended in the substantially same direction as the data line DL, e.g., the second direction (e.g., DR2 in FIG. 4). The gate line GL may deliver a scan signal to the thin film transistor, the data line DL may deliver a data signal to the thin film transistor, and the driving voltage line DVL may provide a driving voltage to the thin film transistor.

The thin film transistor may include a driving thin film transistor TR2 for controlling the organic light emitting device OEL and a switching thin film transistor TR1 for switching the driving thin film transistor TR2. In an implementation, each pixel PXL may include two thin film transistors TR1 and TR2. In an implementation, each pixel PXL may include one thin film transistor and capacitor, or each pixel PXL may include three or more thin film transistors and two or more capacitors.

The switching thin film transistor TR1 may include a first gate electrode GE1, a first source electrode SE1, and a first drain electrode DE1. The first gate electrode GE1 may be connected to the gate line GL, and the first source electrode SE1 may be connected to the data line DL. The first drain electrode DE1 may be connected to a first common electrode CE1 by a fifth contact hole CH5. The switching thin film transistor TR1 may deliver the data signal applied to the data line DL to the driving thin film transistor TR2 according to a scan signal applied to the gate line GL.

The driving thin film transistor TR2 may include the second gate electrode GE2, a second source electrode SE2, and a second drain electrode DE2. The second gate electrode GE2 may be connected to a first common electrode CE1. The second source electrode SE2 may be connected to the driving voltage line DVL. The second drain electrode DE2 may be connected to the first electrode EL1 by a third contact hole CH3.

The organic light emitting device OEL may include a first electrode EL1, a light emitting layer EML on the first electrode EL1, an electron transport layer ETL on the light emitting layer EML, and a second electrode EL2 on the electron transport layer ETL. The first electrode EL1 may be connected to the second drain electrode DE2 of the driving thin film transistor TR2.

The capacitor Cst may be connected between the second gate electrode GE2 and the second source electrode SE2 of the driving thin film capacitor TR2, and may charge and maintain the data signal input to the second gate electrode GE2 of the driving thin film transistor TR2. The capacitor Cst may include a first common electrode CE1 connected to the first drain electrode DE1 by a sixth contact hole CH6, and a second common electrode CE2 connected to the driving voltage line DVL.

A common voltage may be applied to the second electrode EL2, and the light emitting layer EML may display an image by emitting, e.g., a blue light, according to an output signal of the driving thin film transistor TR2.

Figure 6:
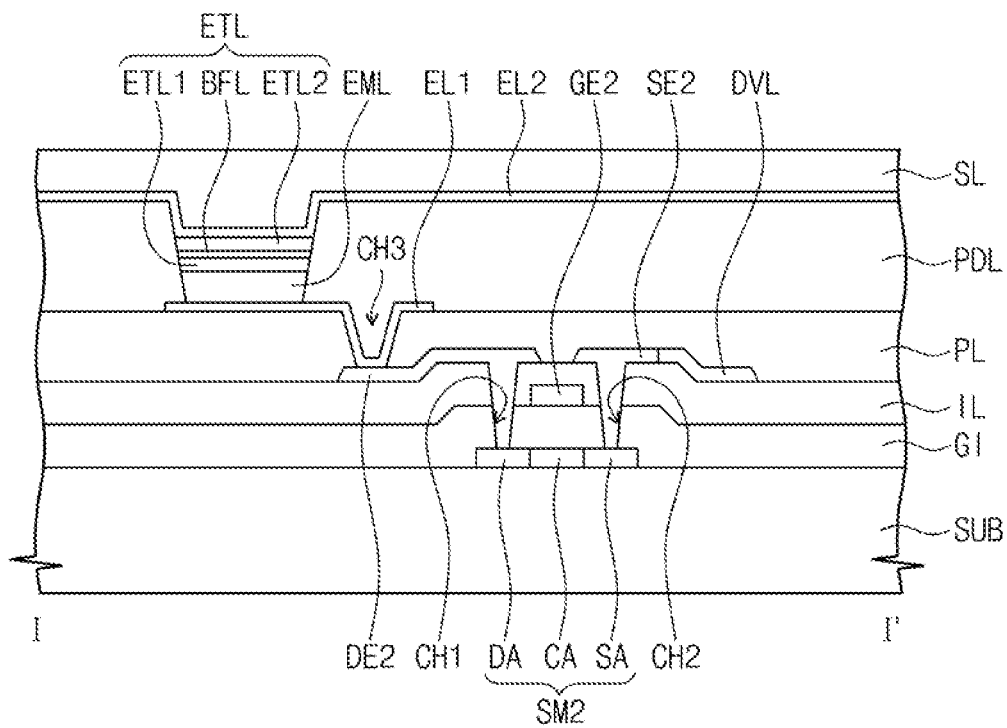
FIG. 6 illustrates a schematic cross-sectional view taken along a line I-I' of FIG. 5.

FIG. 6 illustrates a cross-sectional view taken along a line I-I' of FIG. 5.

Referring to FIGS. 5 and 6, the display device 10 according to an embodiment may include a substrate SUB on which thin film transistors and organic light emitting devices OEL are stacked. The substrate SUB may be formed of a suitable material. For example, it may be formed of an insulating material such as glass, plastic, or a crystal. The organic polymer forming the substrate SUB may include, e.g., polyethylene terephthalate (PET), Polyethylene naphthalate (PEN), polyimide, or polyether sulfone, etc. The substrate may be selected in consideration of mechanical strength, thermal stability, transparency, surface smoothness, tractability, and water resistance, etc.

A substrate buffer layer (not shown) may be disposed on the substrate SUB. The substrate buffer layer (not shown) may help prevent impurities from being spread to the switching and driving thin film transistors TR1 and TR2. The substrate buffer layer (not shown) may be formed of silicon nitride (SiNx), silicon oxide (SiOx), or silicon oxynitride (SiOxNy), etc., or may be omitted according to a material of the substrate SUB and a process condition.

A first semiconductor layer SM1 and a second semiconductor layer SM2 may be disposed on the substrate SUB. The first and second semiconductor layers SM1 and SM2 may be formed of a semiconductor material and respectively operate as activation layers of the switching thin film transistor TR1 and the driving thin film transistor TR2. The first and second semiconductor layers SM1 and SM2 may include source areas SA, drain areas DA, and channel areas CA between the source areas and the drain areas DA, respectively. The first and second semiconductor layers SM1 and SM2 may be respectively formed of an inorganic semiconductor or an organic semiconductor by selection. The source area SA and the drain area DA may be doped with an n-type impurity or a p-type impurity.

A gate insulating layer GI may be on the first and second semiconductor layers SM1 and SM2. A gate insulating layer GI covers the first and second semiconductor layers SM1 and SM2. The gate insulating layer GI may be formed of an organic insulating material or an inorganic insulting material.

The first and second gate electrodes GE1 and GE2 may be on the gate insulating layer GI. The first and second gate electrodes GE1 and GE2 may cover areas corresponding to the channel areas CA of the first and second semiconductor layers SM1 and SM2, respectively.

An interlayer insulating layer IL may be on the first and second gate electrodes GE1 and GE2. The interlayer insulating layer IL may cover the first and second gate electrodes GE1 and GE2. The interlayer insulating layer IL may be formed of an organic insulating material or an inorganic insulting material.

The first source electrode SE1 and the first drain electrode DE1, and the second source electrode SE2 and the second drain electrode DE2 may be on the interlayer insulating layer IL. The second drain electrode DE2 contacts the drain area DA of the second semiconductor layer SM2 by a first contact hole CH1 formed in the gate insulating layer GI and the interlayer insulating layer IL, and the second source electrode SE2 contacts the source area SA of the second semiconductor SM2 by a second contact hole CH2 formed in the gate insulating layer GI and the interlayer insulating layer IL. The first source electrode SE1 contacts a source area (not shown) of the first semiconductor layer SM1 by a fourth contact hole CH4 formed in the gate insulating layer GI and the interlayer insulating layer IL, and the first drain electrode DE1 contacts a drain area (not shown) of the first semiconductor SM1 by a fifth contact hole CH5 formed in the gate insulating layer GI and the interlayer insulating layer IL.

A passivation layer PL may be on the first source electrode SE1 and the first drain electrode DE1, and the second source electrode SE2 and the second drain electrode DE2. The passivation layer PL may play a role of a protection film for protecting the switching and driving thin film transistors TR1 and TR2, or a planarizing film for planarizing a top surface thereof.

The first electrode EL1 may be on the passivation layer PL. The first electrode EL1 may be an anode. The first electrode EL1 may be connected to the second drain electrode DE2 of the driving thin film transistor TR2 through a third contact hole CH3 in the passivation layer PL.

A pixel defining layer PDL dividing pixel areas (PA in FIG. 3) in correspondence to each pixel PXL may be on the passivation layer PL. The pixel defining layer PDL exposes a top surface of the first electrode EL1 and protrudes from the substrate SUB along the perimeter of each pixel PXL. The pixel defining layer PDL may include, e.g., a compound of metal-fluoride ion. For example, the pixel defining layer PDL may include any one compound of metal-fluoride ion selected from LiF, $BaF_2$, and CsF. The compound of metal-fluoride ion may have insulation property in a case of having a predetermined thickness. The thickness of the pixel defining layer PDL may be, e.g., about 10 nm to 100 nm.

A light emitting layer EML may be provided to each of the pixel areas (PA in FIG. 3) surrounded with the pixel defining layer PDL. An electron transport layer ETL may be on the light emitting layer EML. A second electrode EL2 may be on the electron transport layer ETL. Although not shown in the drawing, the display device according to an embodiment may further include each of the hole injection layer (HIL in FIG. 2), the hole transport layer (HTL in FIG. 2), and the electron injection layer (EIL in FIG. 2). The hole injection layer (HIL in FIG. 2), the hole transport layer (HTL in FIG. 2), and the electron injection layer (EIL in FIG. 2) may all be formed, or a part of them may be omitted.

The electron transport layer ETL may include a buffer layer BFL. The buffer layer BFL may include a buffer compound represented by the following Formula 1.

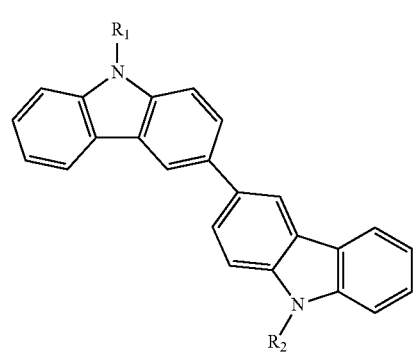

[Formula 1]

In an implementation, $R_1$ and $R_2$ may each independently be selected from or include, e.g., hydrogen, deuterium, a substituted or unsubstituted aromatic ring having a carbon number of 6 to 20, a substituted or unsubstituted condensed aromatic ring having a carbon number of 6 to 20, a substituted or unsubstituted hetero aromatic ring having a carbon number of 6 to 20, and a substituted or unsubstituted condensed hetero aromatic ring having a carbon number of 6 to 20. In an implementation, $R_1$ and $R_2$ may each independently be selected from or include, e.g., a substituted or unsubstituted hetero aromatic ring including N, S, or O having a carbon number of 6 to 20, and a substituted or unsubstituted condensed hetero aromatic ring including N, S, or O having a carbon number of 6 to 20.

In an implementation, $R_1$ and $R_2$ may each independently be selected from or include, e.g., hydrogen, deuterium, a substituted or unsubstituted aryl group having a carbon number of 6 to 20, a substituted or unsubstituted heteroaryl group having a carbon number of 6 to 20, a substituted or unsubstituted aryloxy group having a carbon number of 6 to 20, a substituted or unsubstituted aryl amino group having a carbon number of 6 to 20, a substituted or unsubstituted diarylamino group having a carbon number of 6 to 20, and a substituted or unsubstituted arylalkyl group having a carbon number of 6 to 20.

In an implementation, $R_1$ may be selected from or include, e.g., a phenyl group, a naphthyl group, a biphenyl group, a terphenyl group, an anthracene group, a fluorenyl group, and a carbazolyl group.

In an implementation, $R_2$ may be selected from or include, e.g., a halogen atom, a cyano group, a nitro group, a hydroxy group, and a carboxy group.

In an implementation, the buffer compound may be, e.g., a compound represented by the following Formula 2.

[Formula 2]

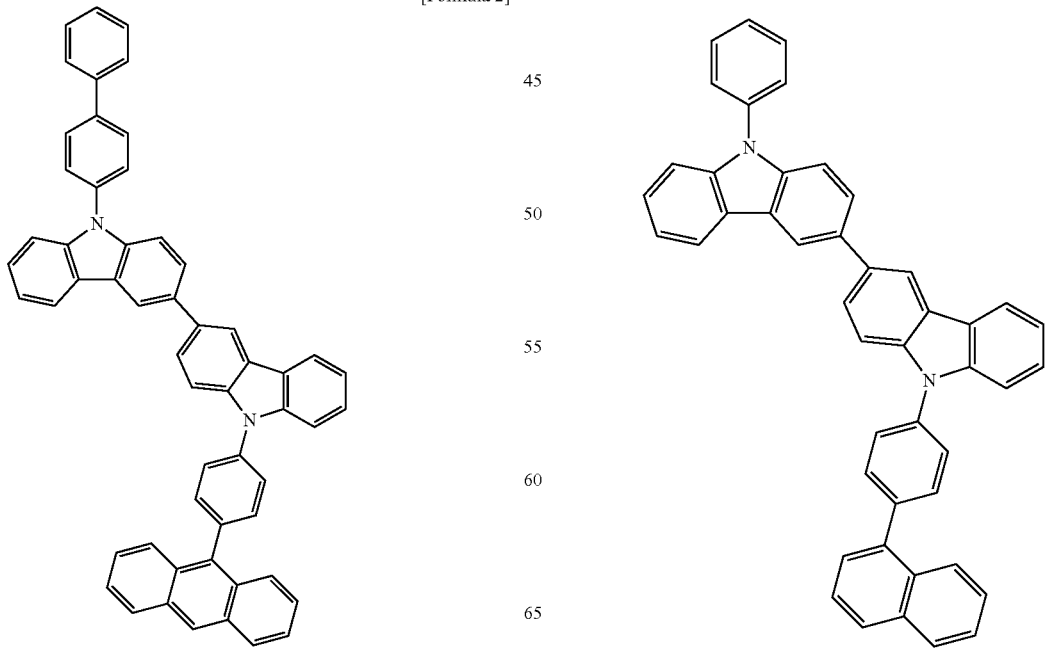

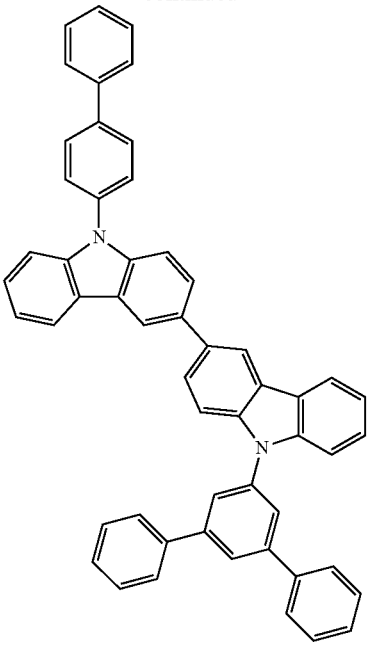 [SMILES: c1ccc(-c2ccc(-n3c4ccccc4c4cc(-c5ccc6c(c5)c5ccccc5n6-c5cc(-c6ccncc6)cc(-c6ccncc6)c5)ccc43)cc2)cc1]

33
-continued
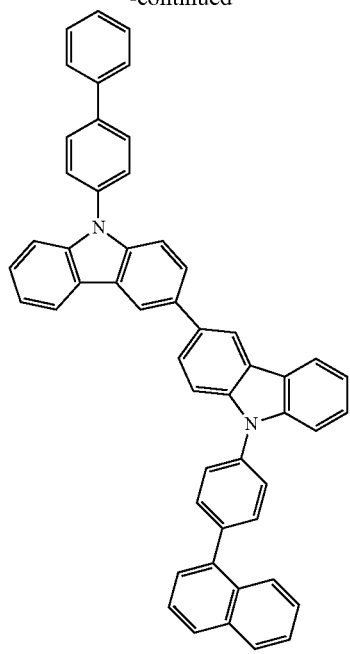
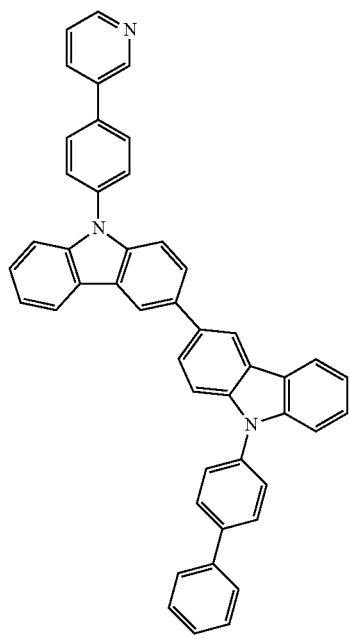
34
-continued
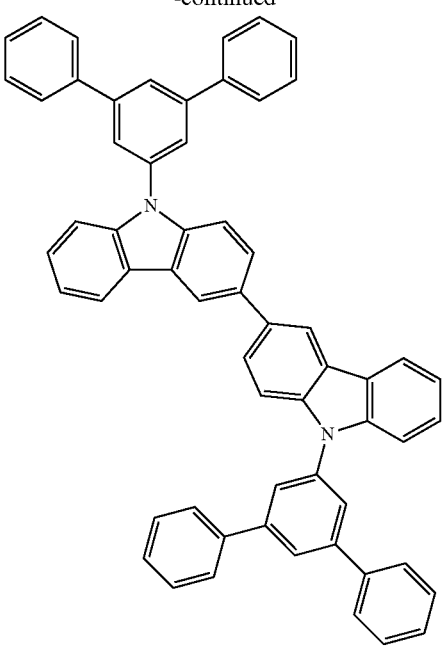
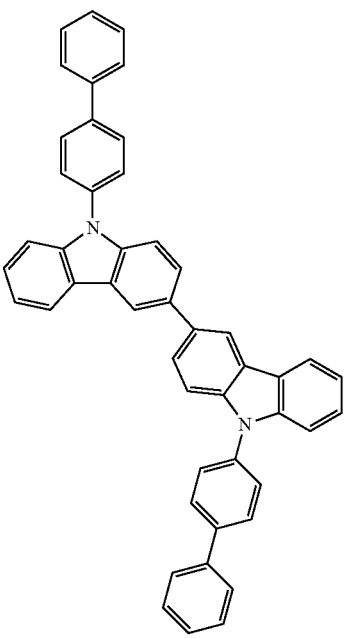

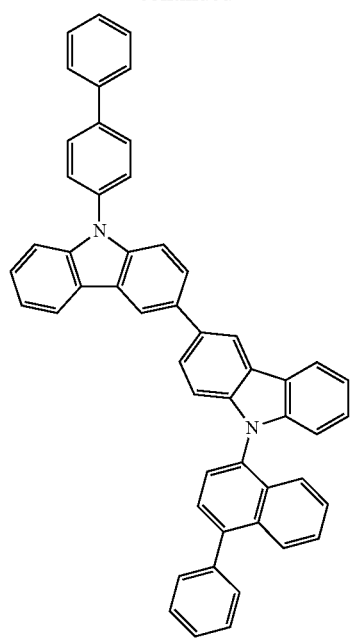

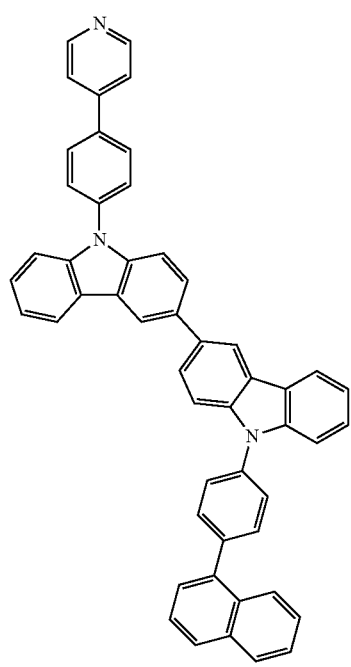

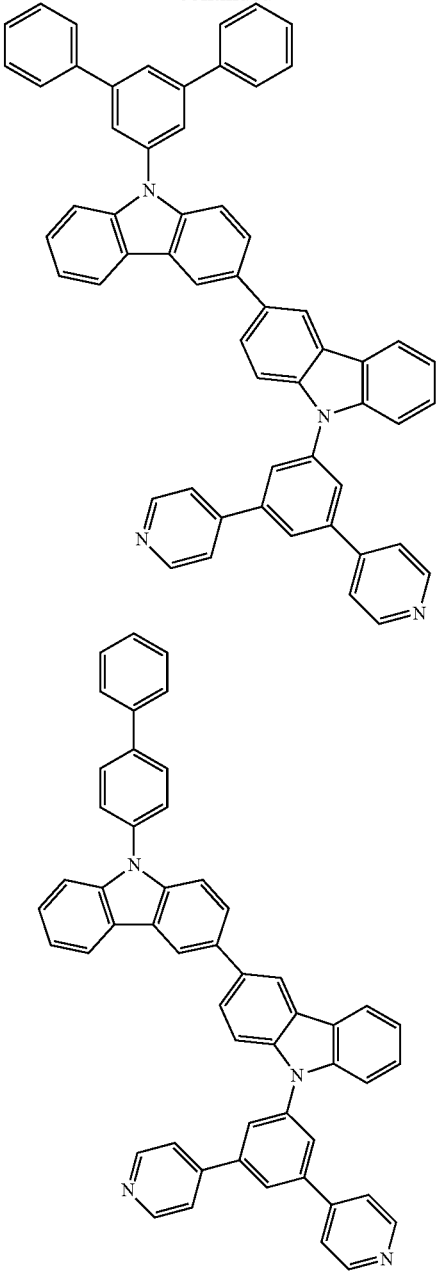

The electron transport layer ETL may include, e.g., a first electron transport layer ETL1, the buffer layer BFL, and a second electron transport layer ETL2. In an implementation, the first or second electron transport layer ETL1 or ETL2 may be omitted, if desired. In an implementation, the electron transport layer ETL may include, e.g., the buffer layer BFL between the first electron transport layer ETL1 and the second electron transport layer ETL2. In an implementation, the buffer layer BFL may be different from the first electron transport layer ETL1 and the second electron transport layer ETL2.

In an implementation, at least one of the first and second electronic transport layers ETL1 and ETL2 may include an electron transport compound. The electron transport compound may include, in a molecule structure thereof, e.g., at least one compound or moiety of the following Formula 3.

[Formula 3]

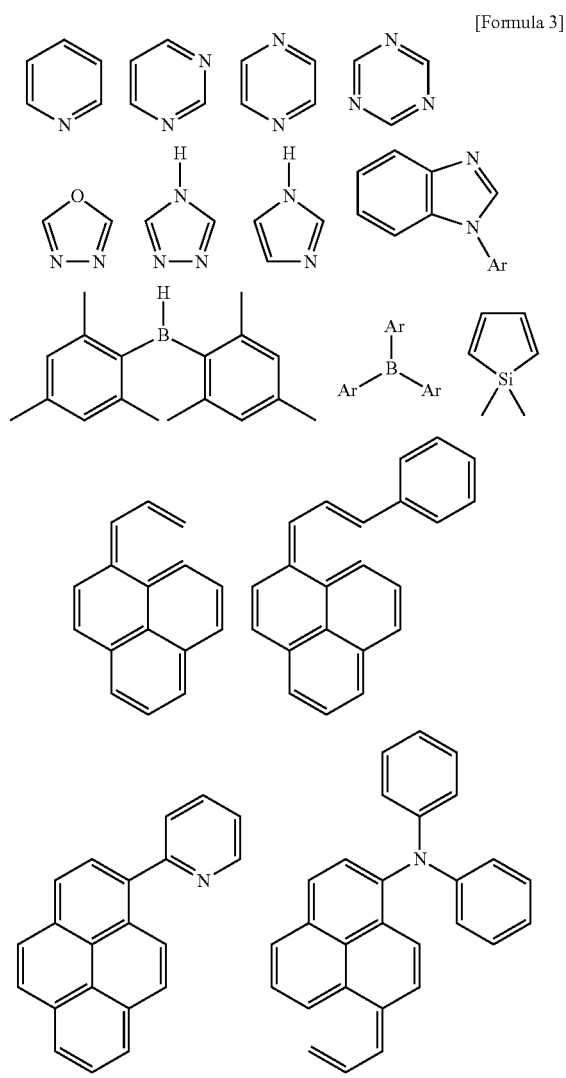

A sealing layer SL covering the second electrode EL2 may be disposed on the second electrode EL2. The sealing layer SL may include at least one of an organic layer and an inorganic layer. The sealing layer SL protects the organic light emitting device OEL.

A display device according to an embodiment may reduce the band gap between the energy band of the light emitting layer and the energy band of the electron transport layer and may facilitate electron injection to the light emitting layer by including the buffer layer including the buffer compound represented by the Formula 1. Accordingly, the display device according to an embodiment may promote high efficiency and the long life.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

EXAMPLES

Example 1

An anode having a thickness of 2,000 Å was formed of ITO, and a light emitting layer was formed by vapor deposition to have a thickness of 300 Å by using (4,6-$F_2$ppy)$_2$Irpic as a dopant and tris(8-quinolinolate)aluminum (Alq3) as a host. Then, the first electron transport layer having a thickness of 100 Å was formed using a compound represented by the following Formula 4 on a top surface of the light emitting layer. A buffer layer having a thickness of 30 Å was formed using a buffer compound represented by the following Formula 5 on a top surface of the first electron transport layer.

[Formula 4]

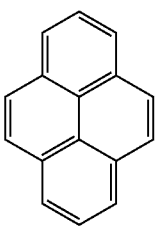

[Formula 5]

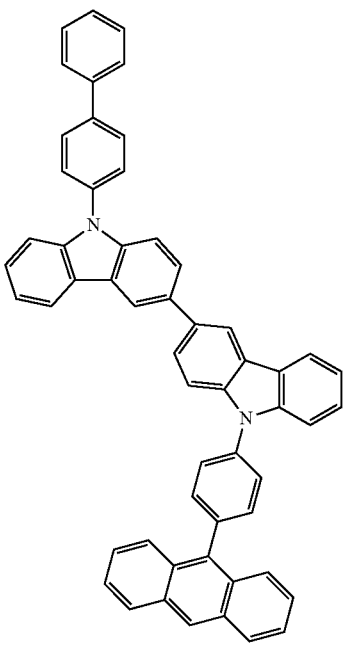

An organic light emitting device was manufactured by forming a second electron transport layer having a thickness of 100 Å using a compound represented by the Formula 4 on the buffer layer, and forming a cathode having a thickness of 2,000 Å using Al.

Comparative Example 1

When the first electron transport layer, the buffer layer, and the second electron transport layer of Example 1 were totally called as electron transport layer, the organic light emitting device was manufactured identically to Example 1 except for forming the electron transport layer with a single layer using the compound represented by Formula 4 to have a same thickness as the entire electron transport layer of Example 1.

Experiment Result

Figure 7:
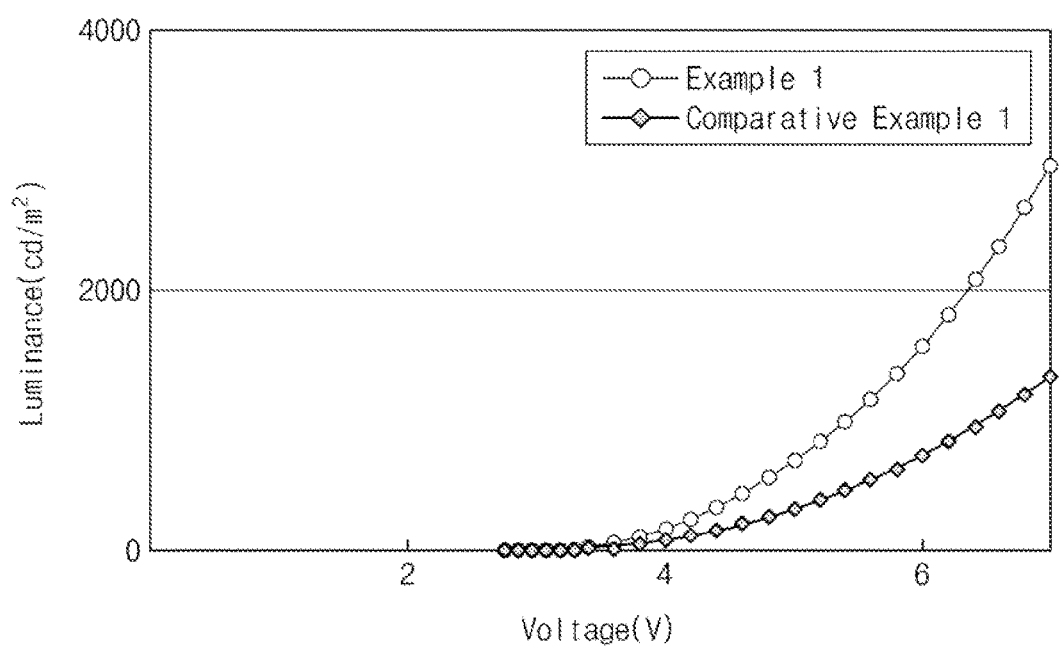
FIG. 7 illustrates a graph representing a relationship between a voltage and luminance of each organic light emitting device of Example 1 and Comparative Example 1.

Driving voltages of the organic light emitting devices of Example 1 and Comparative Example 1 were measured and shown in Table 1. In addition, a relationship between a voltage and luminance of the organic light emitting device of Example 1 and relationship between a voltage and luminance of the organic light emitting device of Comparative Example 1 were measured and shown in FIG. 7.

TABLE 1

|  | Driving voltage (v) |
| --- | --- |
| Example 1 | 5.3 |
| Comparative Example 1 | 5.8 |

Referring to Table 1, it may be seen that the organic light emitting device of Example 1 was driven with a lower driving voltage than that of the organic light emitting device of Comparative Example 1. Furthermore, referring to FIG. 7, it may also be seen that the organic light emitting device of Example 1 had higher luminance at an identical voltage compared to the organic light emitting device of Comparative Example 1 and accordingly had higher efficiency.

In an organic light emitting device according to an embodiment, efficiency may be improved and life may be elongated.

In a display device according to an embodiment, efficiency may be improved and life may be elongated.

The embodiments may provide an organic light emitting device having high efficiency and long life.

The embodiments may provide a display device including an organic light emitting device having high efficiency and long life.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic light emitting device, comprising:
a first electrode;
a light emitting layer on the first electrode;
an electron transport layer on the light emitting layer; and
a second electrode on the electron transport layer,
wherein the electron transport layer includes a buffer layer, the buffer layer including a buffer compound represented by the following Formula 1,

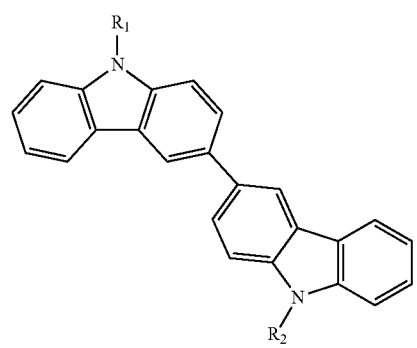

[Formula 1]

wherein, in Formula 1, $R_1$ and $R_2$ are each independently selected from a hydrogen, deuterium, a halogen atom, a cyano group, a nitro group, a hydroxy group, a carboxyl group, a substituted or unsubstituted aromatic ring having a carbon number of 6 to 20, a substituted or unsubstituted condensed aromatic ring having a carbon number of 6 to 20, a substituted or unsubstituted heteroaromatic ring having a carbon number of 6 to 20, a substituted or unsubstituted condensed heteroaromatic ring having a carbon number of 6 to 20, a substituted or unsubstituted aryloxy group having a carbon number of 6 to 20, a substituted or unsubstituted aryl amino group having a carbon number of 6 to 20, a substituted or unsubstituted diarylamino group having a carbon number of 6 to 20, and a substituted or unsubstituted arylalkyl group having a carbon number of 6 to 20.

2. The organic light emitting device as claimed in claim 1, wherein $R_1$ and $R_2$ are each independently selected from hydrogen, deuterium, a substituted or unsubstituted aromatic ring having a carbon number of 6 to 20, a substituted or unsubstituted heteroaromatic ring having a carbon number of 6 to 20, a substituted or unsubstituted aryloxy group having a carbon number of 6 to 20, a substituted or unsubstituted aryl amino group having a carbon number of 6 to 20, a substituted or unsubstituted diarylamino group having a carbon number of 6 to 20, and a substituted or unsubstituted arylalkyl group having a carbon number of 6 to 20.

3. The organic light emitting device as claimed in claim 1, wherein $R_1$ is selected from a phenyl group, a naphthyl group, a biphenyl group, a terphenyl group, an anthracenyl group, a fluorenyl group, and a carbazolyl group.

4. The organic light emitting device as claimed in claim 1, wherein $R_2$ is selected from a halogen atom, a cyano group, a nitro group, a hydroxy group, and a carboxyl group.

5. The organic light emitting device as claimed in claim 1, wherein the buffer compound is a compound represented by the following Formula 2:

[Formula 2]
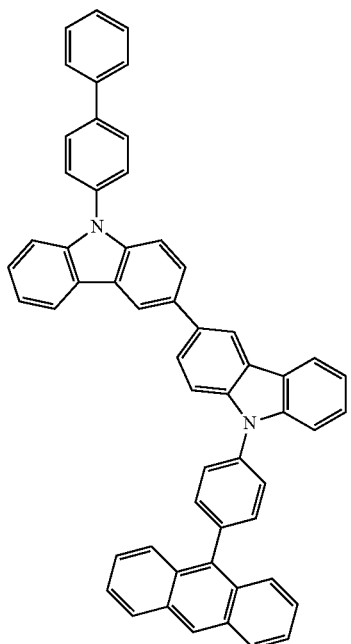
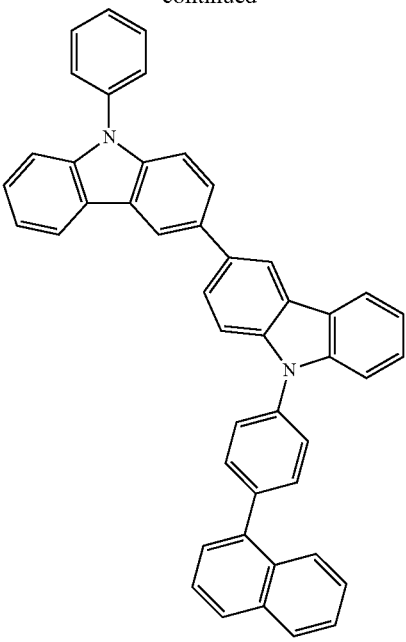
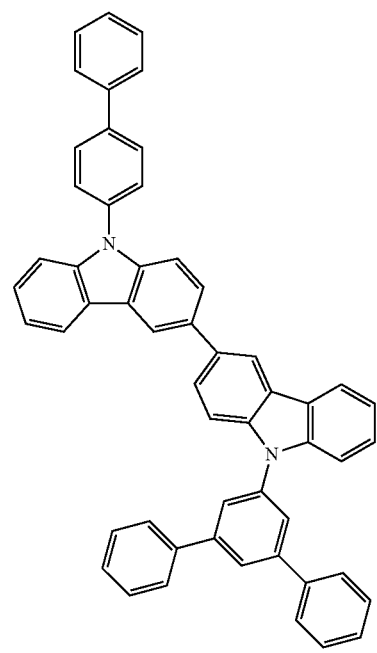
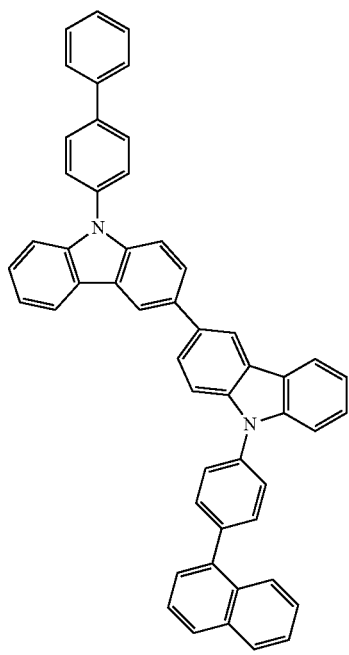

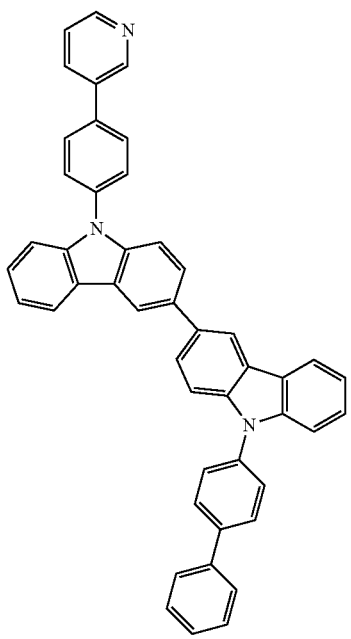
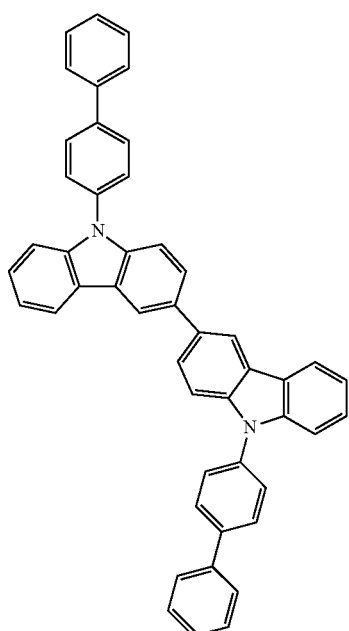
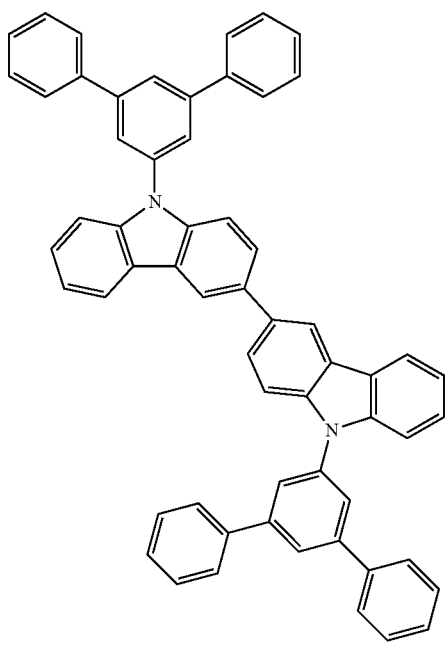
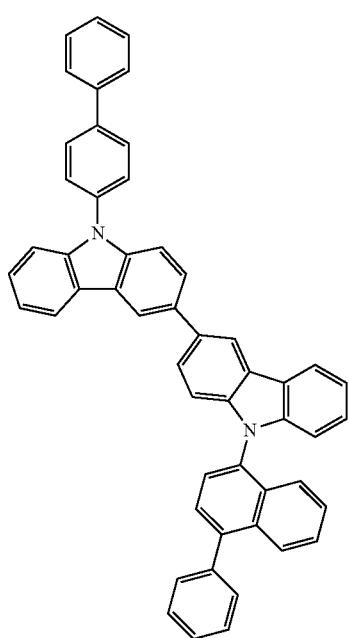

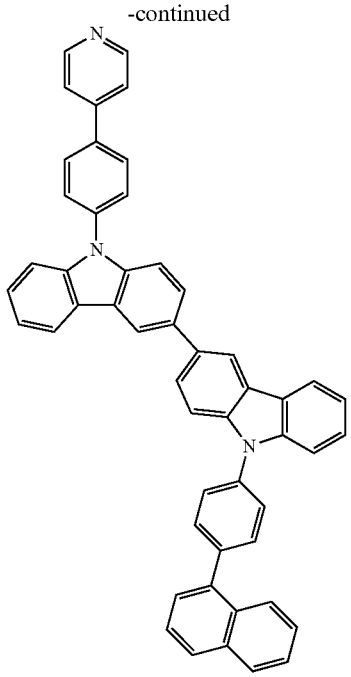

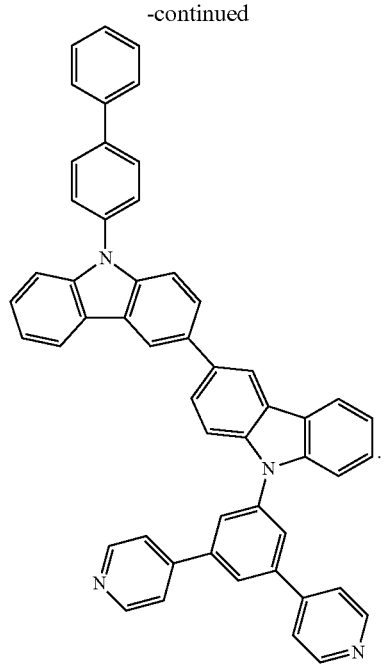

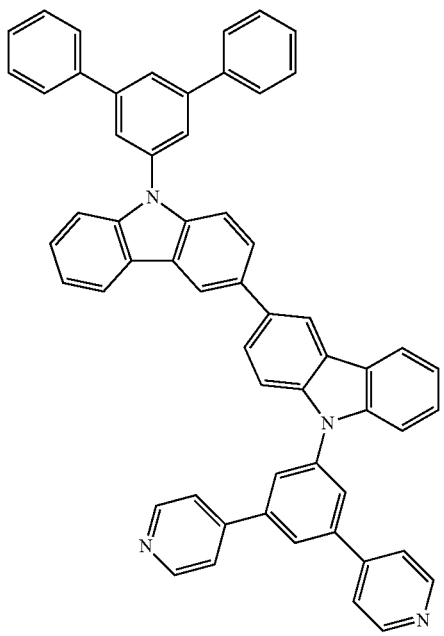

6. The organic light emitting device as claimed in claim 1, wherein the electron transport layer includes:
a first electron transport layer on the light emitting layer;
the buffer layer on the first electron transport layer; and
a second electron transport layer on the buffer layer.

7. The organic light emitting device as claimed in claim 6, wherein:
at least one of the first electron transport layer and the second electron transport layer includes an electron transport compound, and
the electron transport compound includes a compound or moiety represented by the following Formula 3:

[Formula 3]

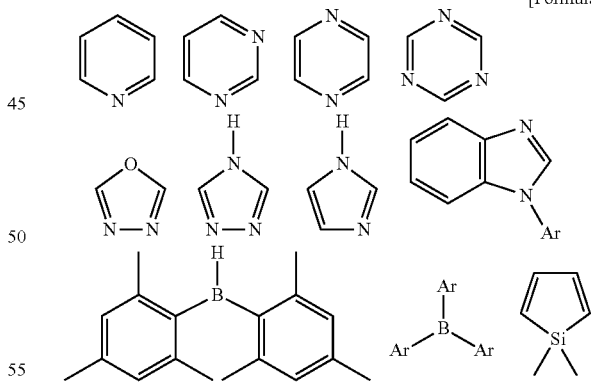

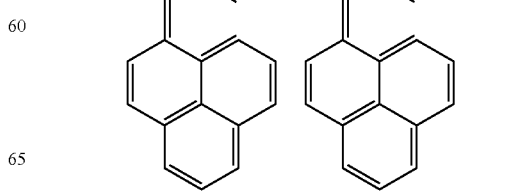

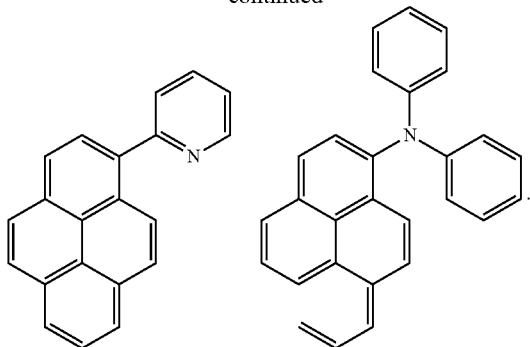

8. The organic light emitting device as claimed in claim 1, wherein the buffer layer has a thickness of about 10 Å to about 40 Å.

9. The organic light emitting device as claimed in claim 1, further comprising a hole transport layer between the first electrode and the light emitting layer.

10. The organic light emitting device as claimed in claim 9, wherein the hole transport layer includes at least one selected from N-phenylcarbazole, polyvinylcarbazole, N,N'-bis(3-methylphenyl)-N,N'-diphenyl-[1,1-biphenyl]-4,4'-diamine, N,N'-di(1-naphthyl)-N,N'-diphenylbenzidine, 4,4',4"-tris(N-carbazolyl)triphenylamine), and 4,4'-cyclohexylidenebis[N,N-bis(4-methylphenyl)benzenamine].

11. The organic light emitting device as claimed in claim 9, further comprising a hole injection layer between the first electrode and the hole transport layer.

12. The organic light emitting device as claimed in claim 11, wherein the hole injection layer includes at least one selected from copper phthalocyanine, N,N-diphenyl-N,N-bis-[4-(phenyl-m-tolyl-amino)-phenyl]-biphenyl-4,4'-diamine, 4,4',4"-tris(3-methylphenylphenylamino)triphenylamine, 4,4'4"-tris(N,N-diphenylamino)triphenylamine, 4,4',4"-tris{N,-(2-naphthyl)-N-phenylamino}-triphenylamine, poly(3,4-ethylenedioxythiophene)/poly(4-styrenesulfonate), polyaniline/dodecylbenzenesulfonic acid, polyaniline/camphor sulfonic acid, and polyaniline/poly(4-styrenesulfonate).

13. The organic light emitting device as claimed in claim 1, further comprising an electron injection layer between the electron transport layer and the second electrode.

14. The organic light emitting device as claimed in claim 13, wherein the electron injection layer includes at least one selected from LiF, LiQ, Li$_2$O, BaO, NaCl, and CsF.

* * * * *